United States Patent [19]

Papenberg et al.

[11] Patent Number: 5,379,415

[45] Date of Patent: Jan. 3, 1995

[54] FAULT TOLERANT MEMORY SYSTEM

[75] Inventors: Robert L. Papenberg; Runchan D. Yang; David H. Wotring; Mohammad F. Rydhan; Paul Voloshin, all of San Jose; Mohamed M. Talaat, Mountain View, all of Calif.

[73] Assignee: Zitel Corporation, Fremont, Calif.

[21] Appl. No.: 954,169

[22] Filed: Sep. 29, 1992

[51] Int. Cl.⁶ .................................................. G06F 11/08
[52] U.S. Cl. ...................................... 395/575; 371/47.1; 364/271; 364/271.1
[58] Field of Search .................. 371/36, 47.1, 40.1; 364/271, 271.1, 271.2, 271.3, 271.4; 395/575

[56] References Cited

U.S. PATENT DOCUMENTS

| | | | |
|---|---|---|---|
| 3,921,149 | 11/1975 | Kreis | 340/172.5 |
| 4,021,784 | 5/1977 | Kimlinger | 340/172.5 |
| 4,375,683 | 3/1983 | Wensley | 371/36 |
| 4,644,498 | 2/1987 | Bedard | 364/900 |
| 4,827,401 | 5/1989 | Hrustich | 364/200 |
| 4,920,540 | 4/1990 | Baty | 371/47.1 X |
| 4,965,717 | 10/1990 | Cutts | 364/200 |
| 4,984,241 | 1/1991 | Truong | 371/36 |
| 5,005,174 | 4/1991 | Bruckert | 371/68.3 |
| 5,027,357 | 6/1991 | Yu et al. | 371/37.7 |
| 5,233,615 | 8/1993 | Goetz | 371/36 |

OTHER PUBLICATIONS

"Detect/Correct Errors to Improve Data Reliability", A. Hegde, Electronic Design Jun. 11, 1992.
"Ultra-Reliable Voter Switches with a Bibliography of Mechanization", N. Dennis, Microelectronics and Reliability, vol. 13, pp. 299–308, 1974.
"The Endurance of EEPROMs/Utilizing Fault Tolerant Memory Cells", IEEE 1990, pp. 378–380, Annual Reliability and Maintainability Symposium.
"Fault Tolerant Integrated Memory", C. Njinda et al., Colloquium on Fault Tolerant ICs/Wafer Scale Integration, Digest No. 1986/23.
"Architecture and Implementation of a Fault-Tolerant Computer", Degen et al Institute of Electrical and Electronics Engineering, 1987, pp. 261–265.
"Fault Tolerant Power Controller", Gudea et al., TRW Space and Technology Group, Redondo Beach, California, 90278, Paper No. 889402, pp. 441–444.
"Design of Self-Checking and Fault-Tolerant Microprogrammed Controllers", I. Williamson, The Radio and Electronic Engineer, vol. 47, No. 10, pp. 449–454.
"Shaped Memory for a Fault-Tolerant Computer", G. Gilley, NASA Case NPO-13139, Contract NAS7-100, Application Ser. No. 393,524, filed Aug. 31, 1973.
"Microcomputer Reliability Improvement Using Triple-Modular Redundancy", J. Wakerly, Proceedings of the III, Vo. 64, No. 6, pp. 889–895.
"A Fault Tolerant Module For Real-Time Monitoring Applications", R. Ruiz et al. Session A.II; Nouveaux Systems Experts Et Logiciels, pp. 77–83.

Primary Examiner—Robert W. Beausoliel, Jr.
Assistant Examiner—Glenn Snyder
Attorney, Agent, or Firm—Steven F. Caserza

[57] ABSTRACT

A memory system in which fault tolerance is achieved utilizing redundant clocks. The redundant clocks are synchronized, and a voter is used to deselect nonmatching clocks, thereby avoiding clocking errors. A circuit is provided to ensure a nonoscillating clock provides an output level at a desired state. Another circuit is provided to ensure oscillation upon power up.

7 Claims, 24 Drawing Sheets

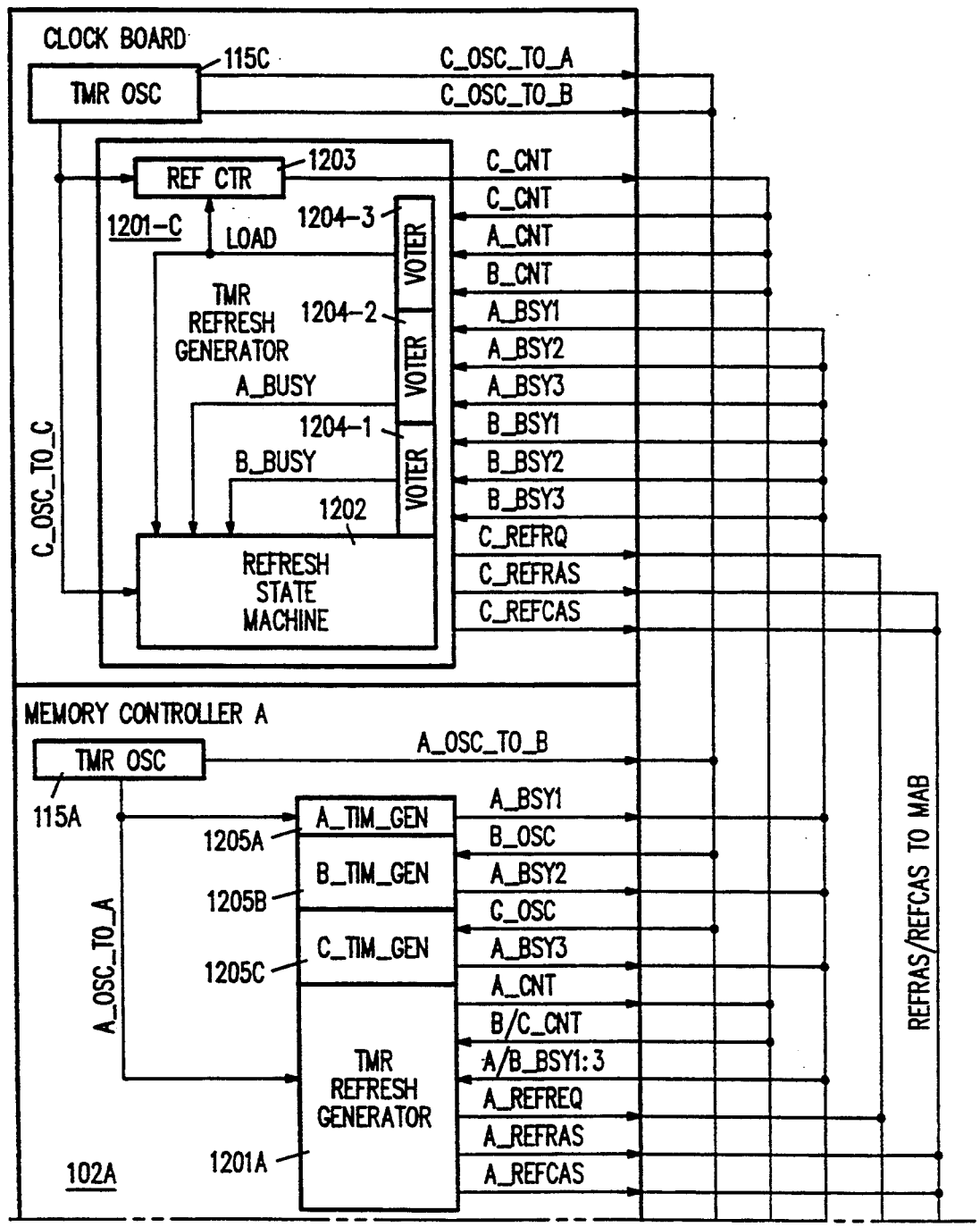
FIG. 2A(1)

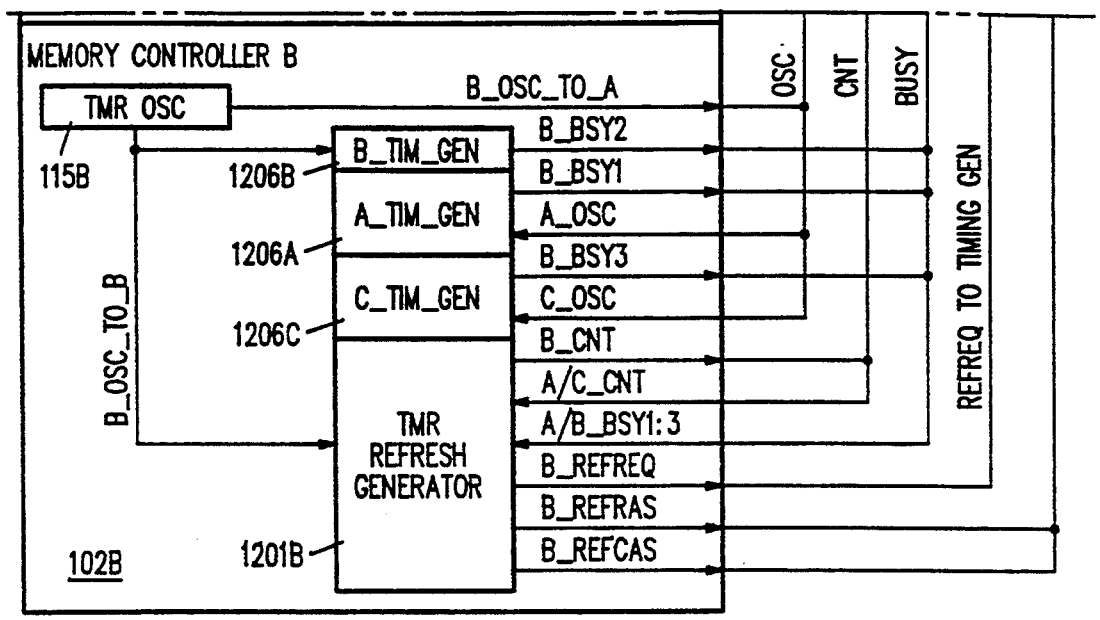
FIG. 2A(2)

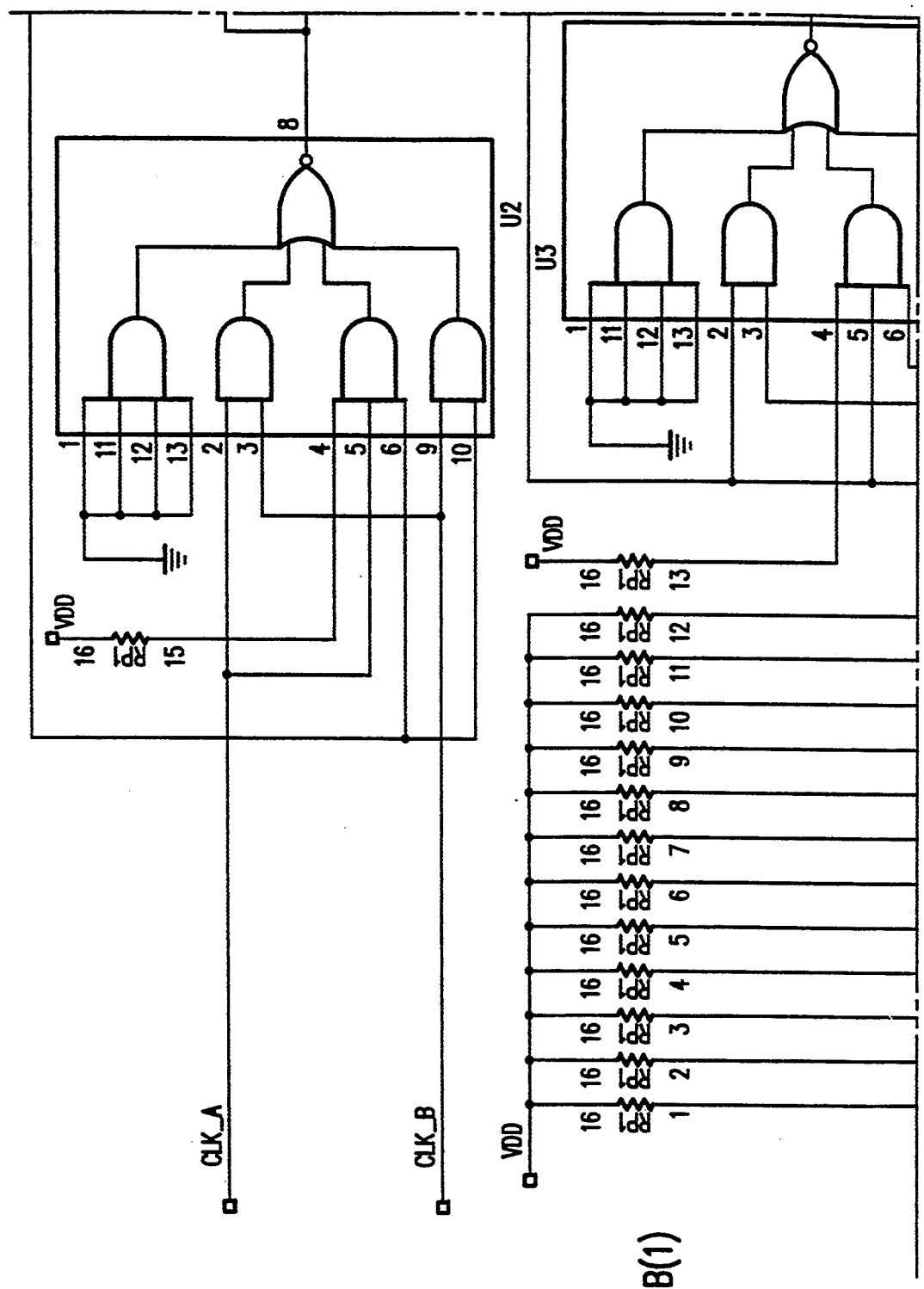
FIG. 2B(1)

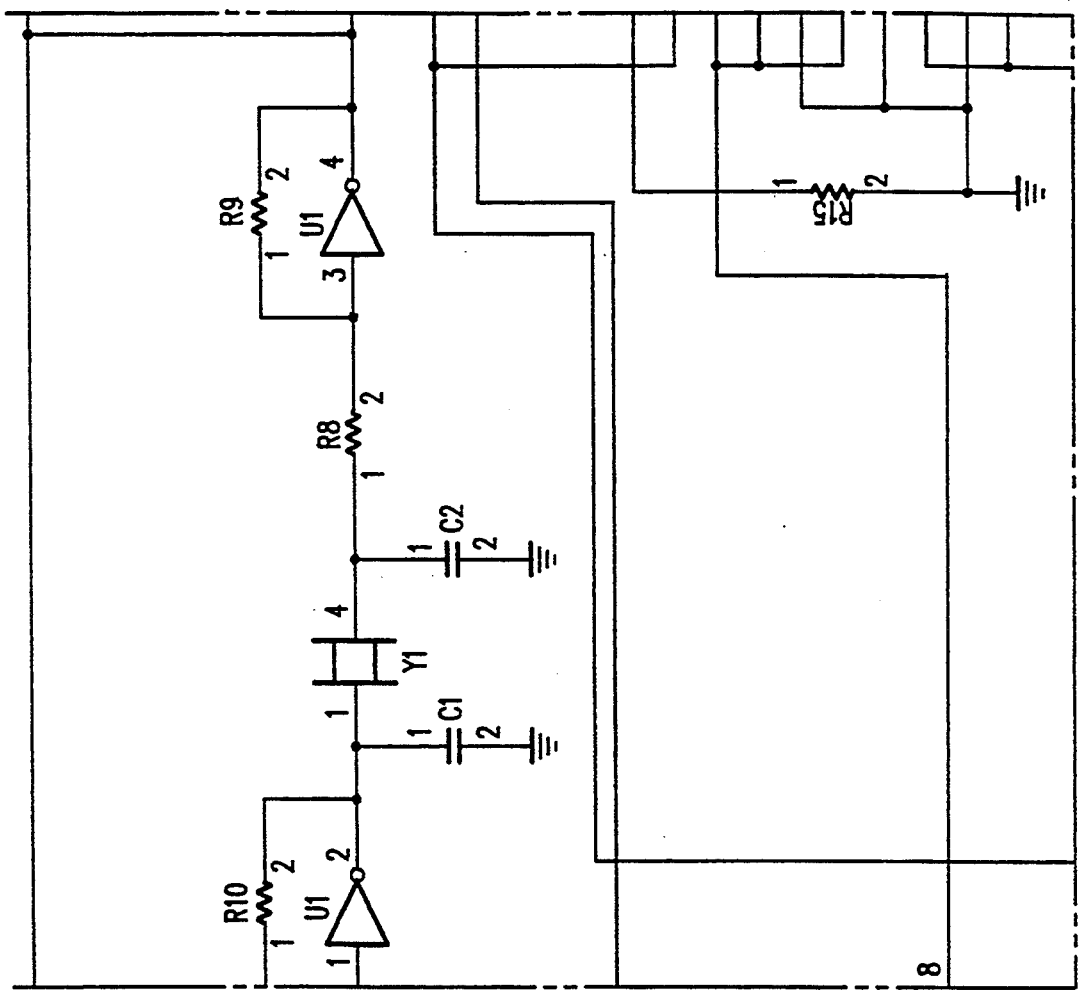
FIG. 2B(2)

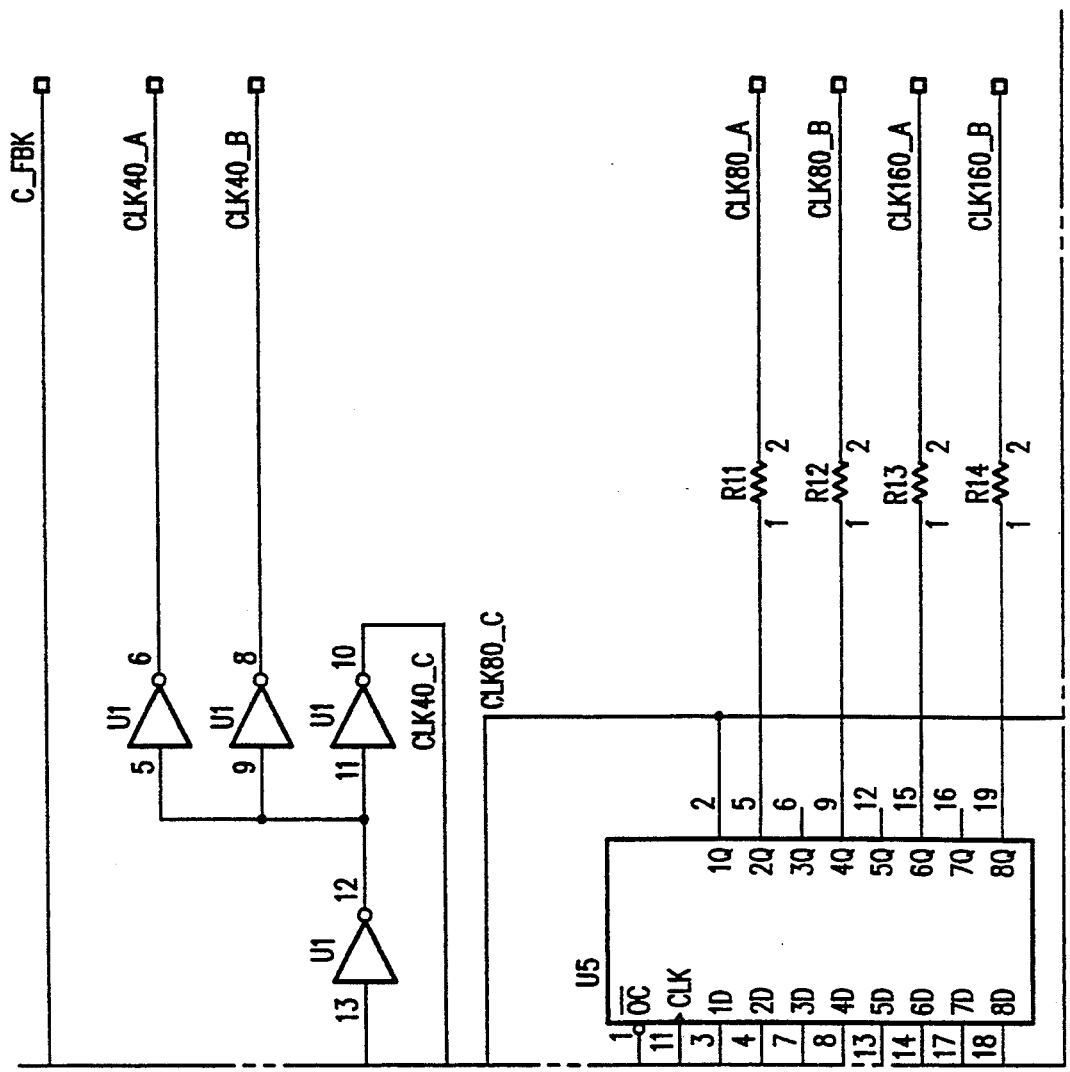
FIG. 2B(3)

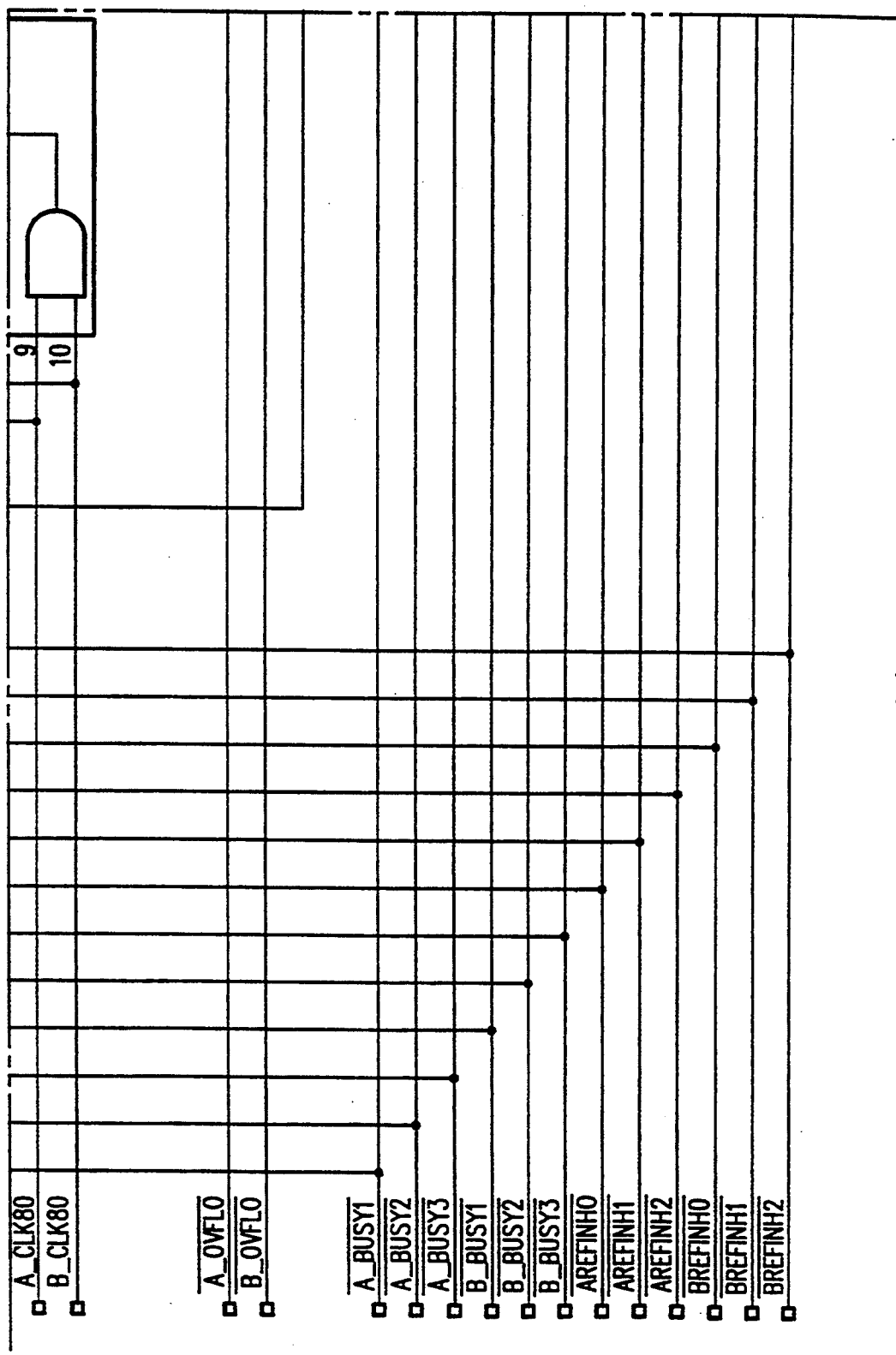
FIG. 2B(4)

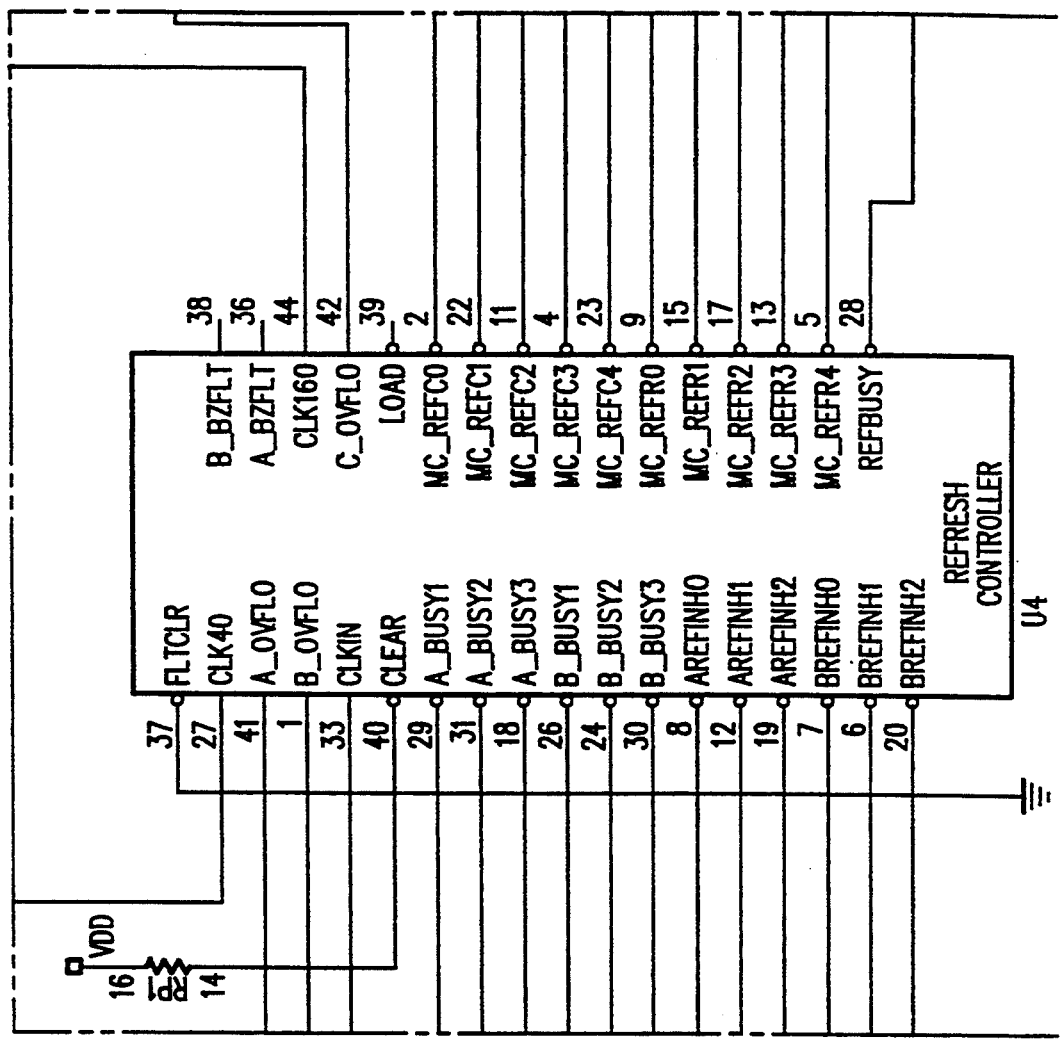
FIG. 2B(5)

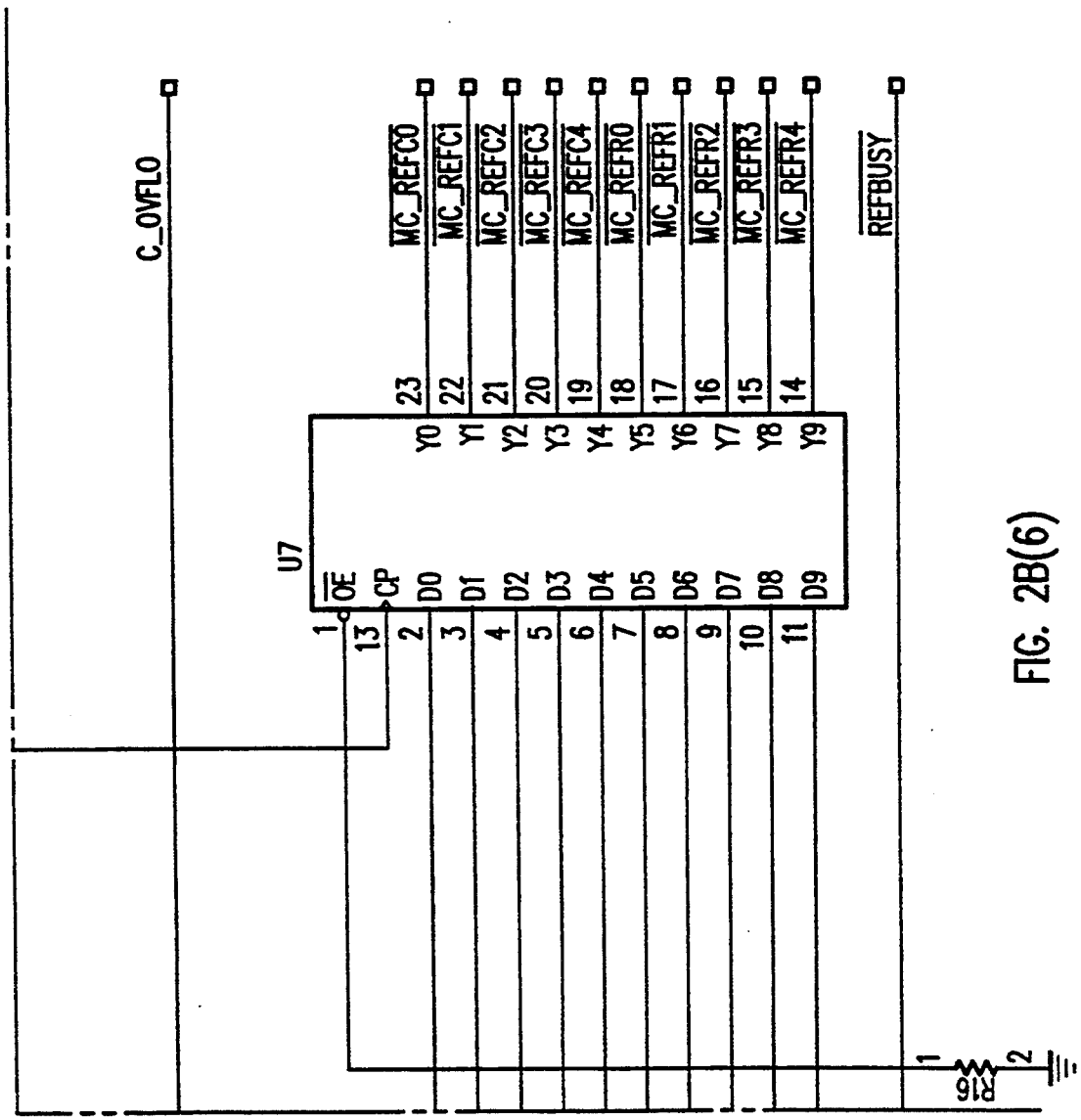
FIG. 2B(6)

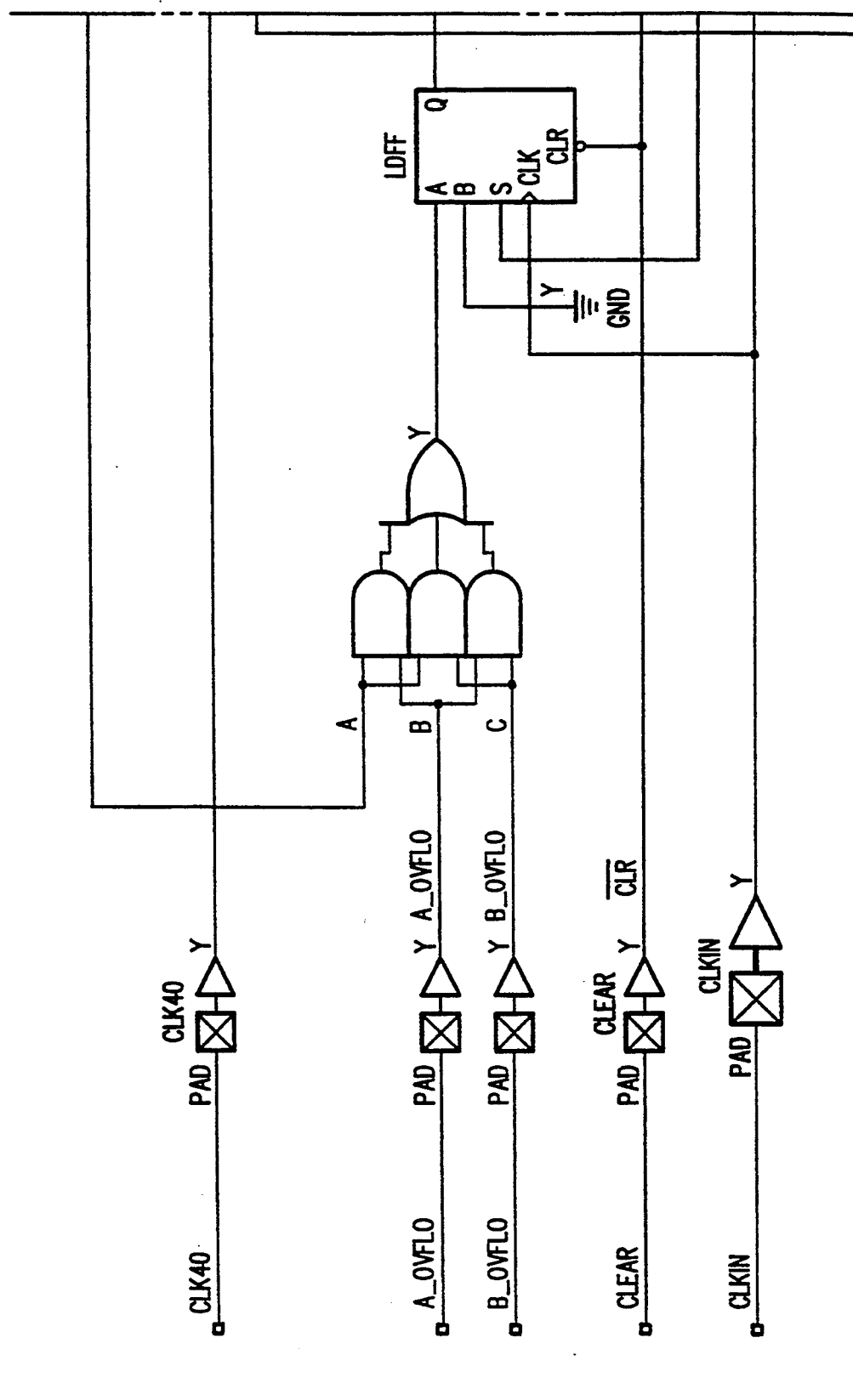
FIG. 2C(1)

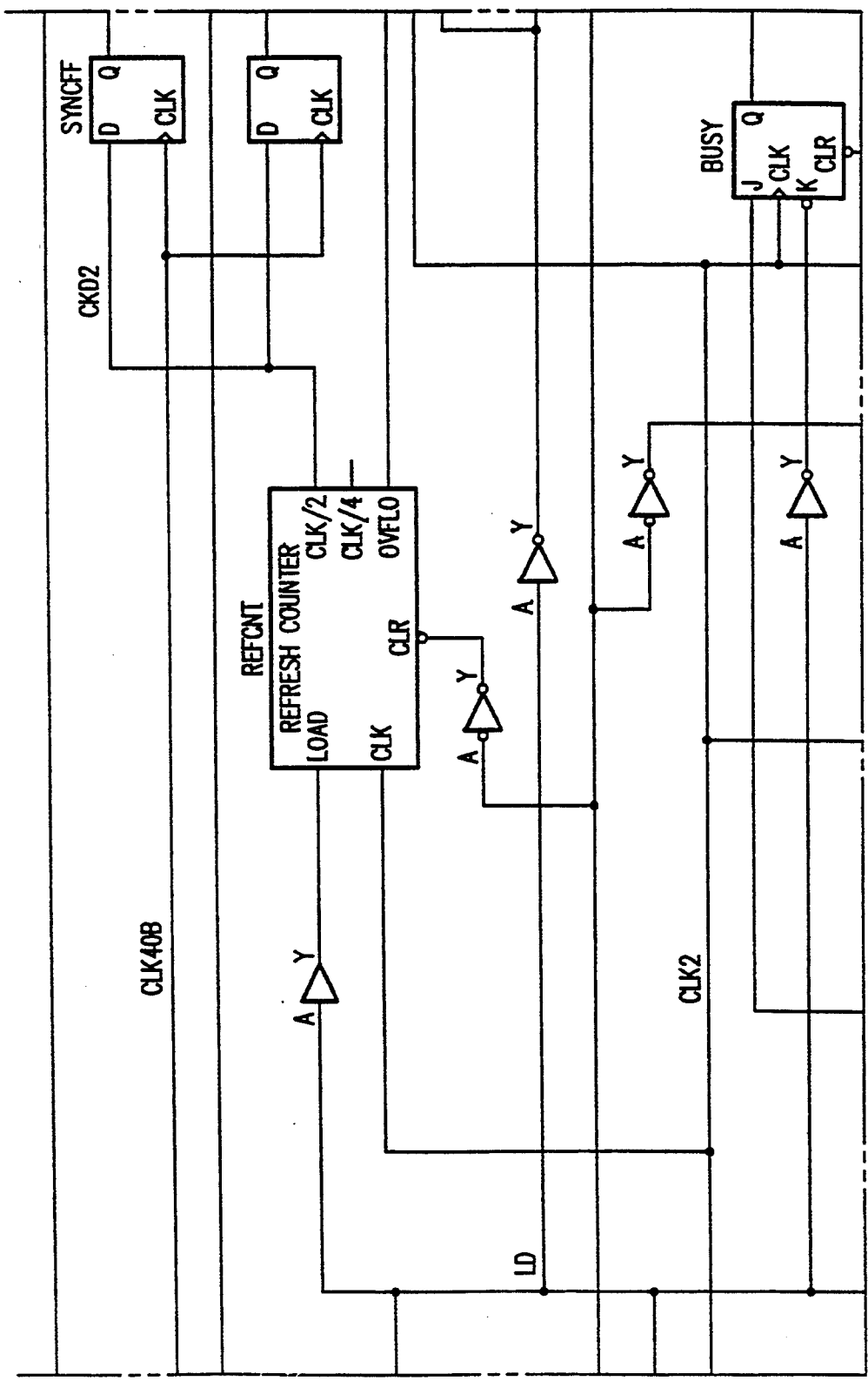
FIG. 2C(2)

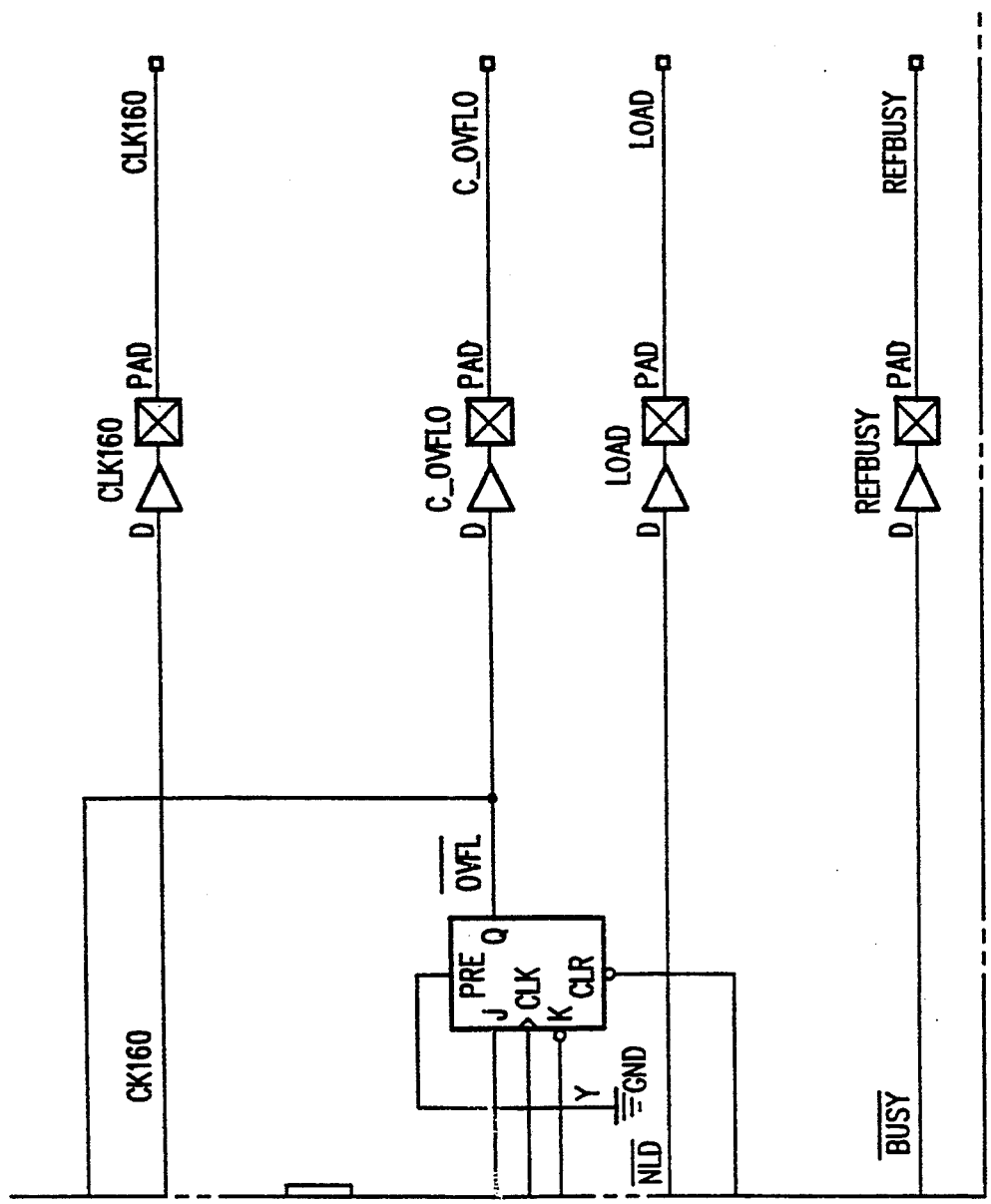
FIG. 2C(3)

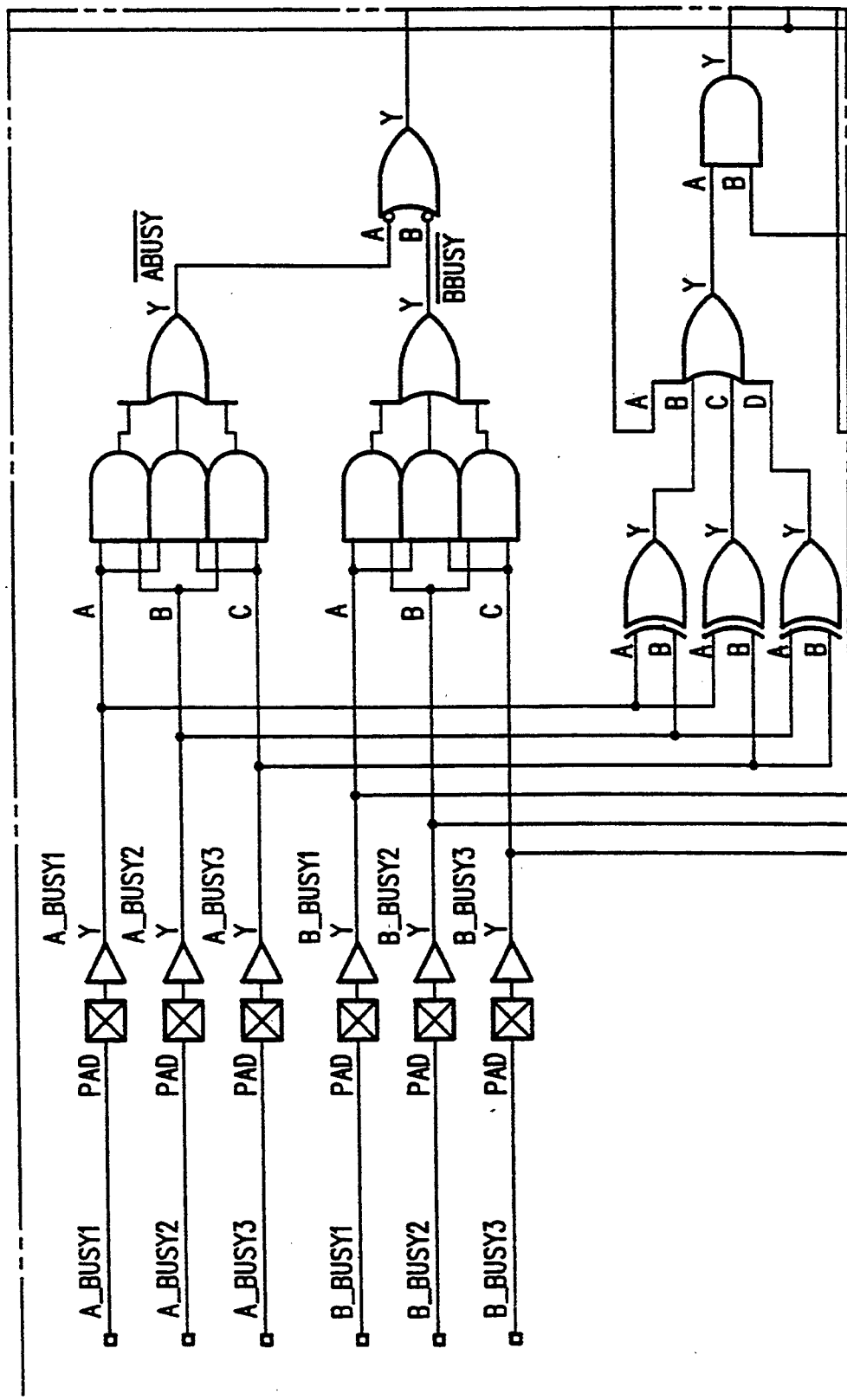
FIG. 2C(4)

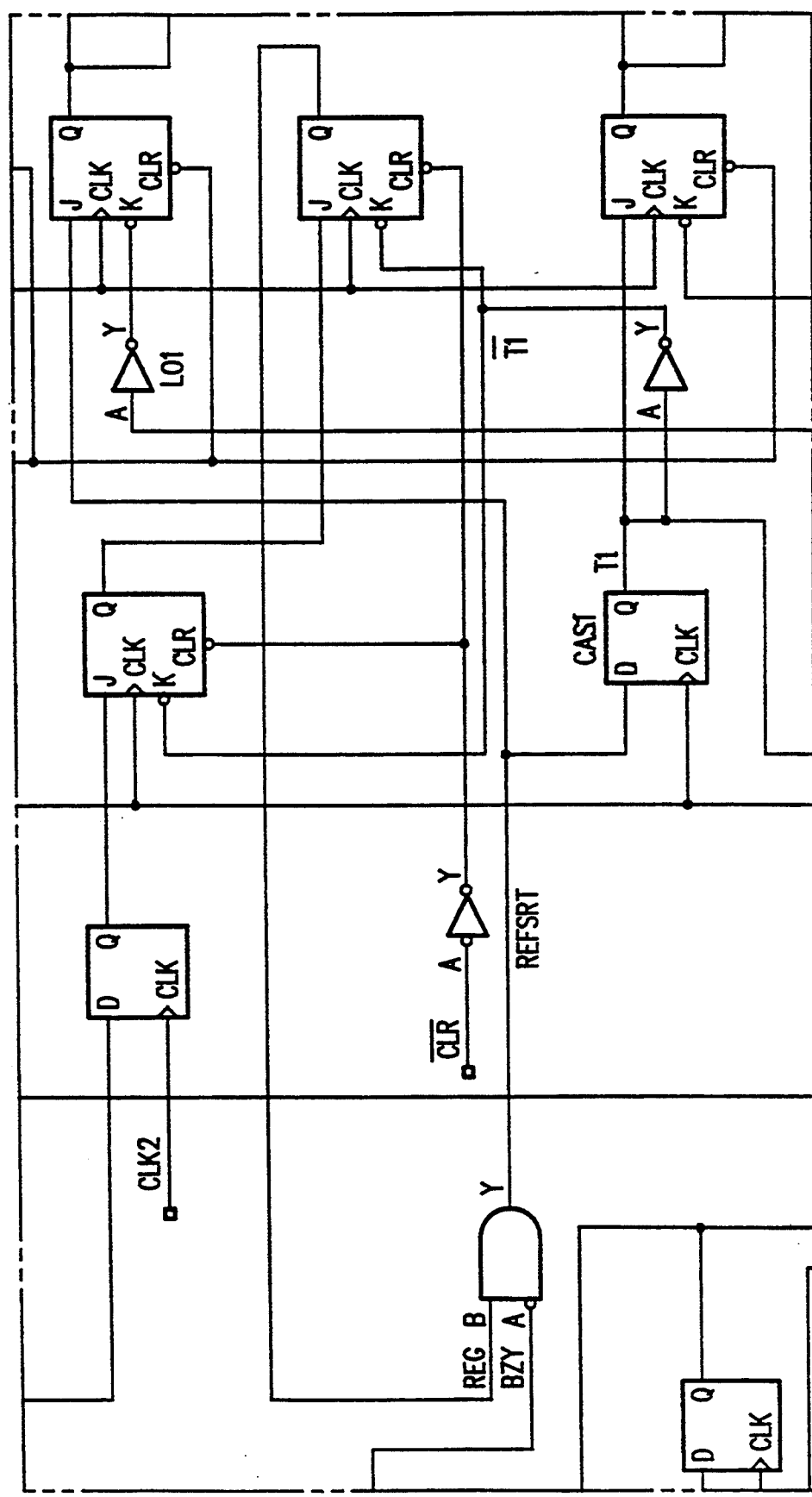
FIG. 2C(5)

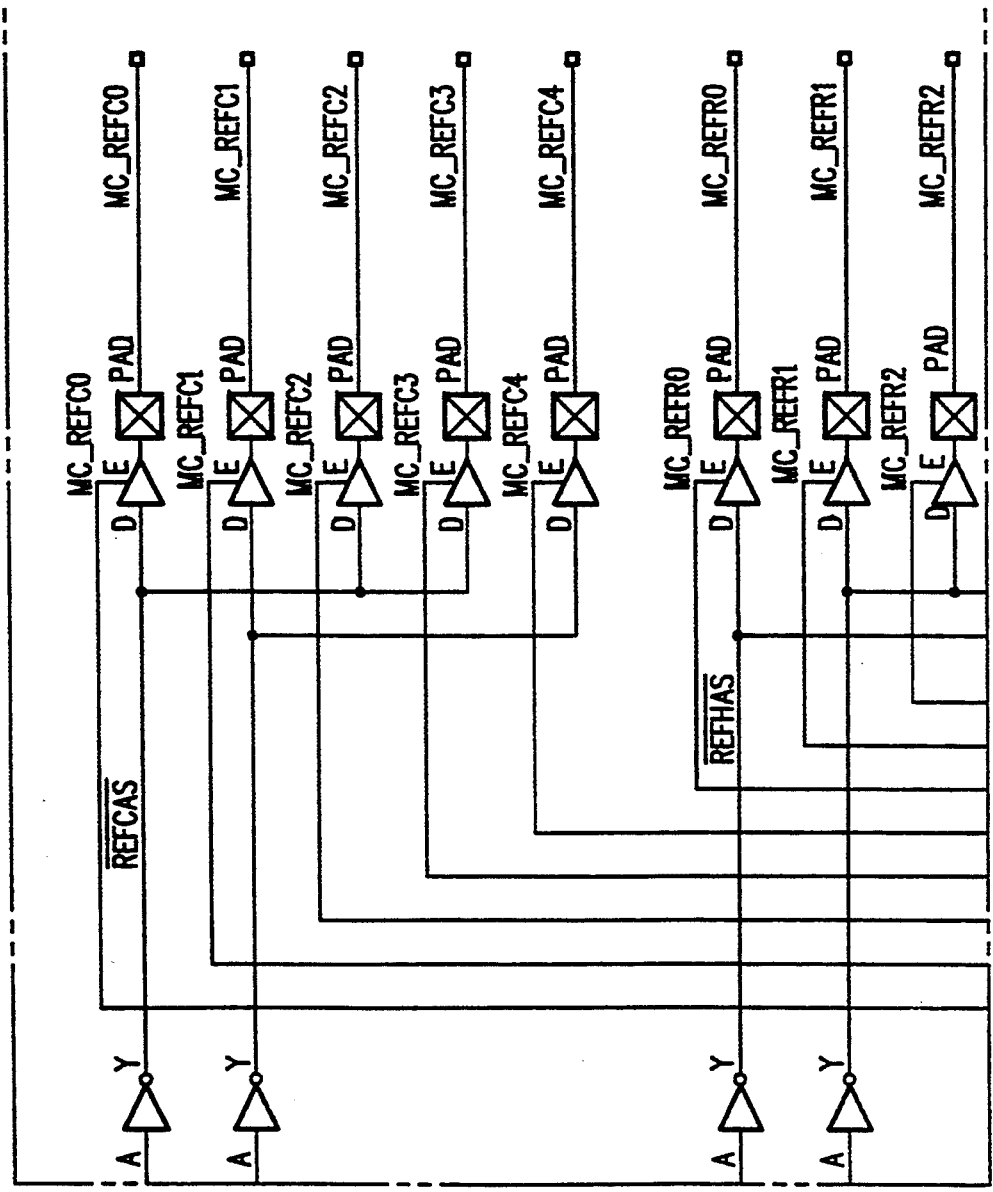
FIG. 2C(6)

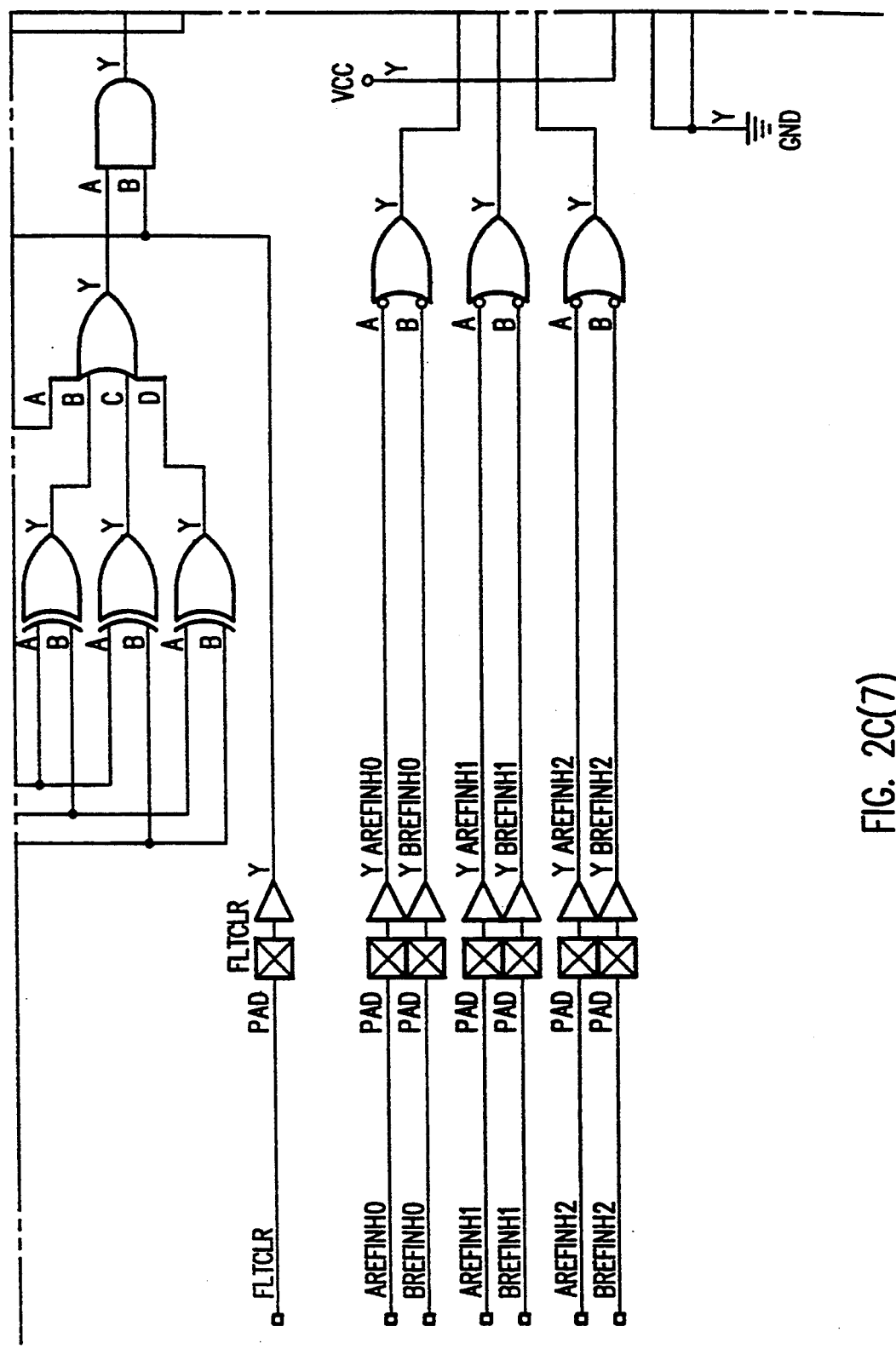
FIG. 2C(7)

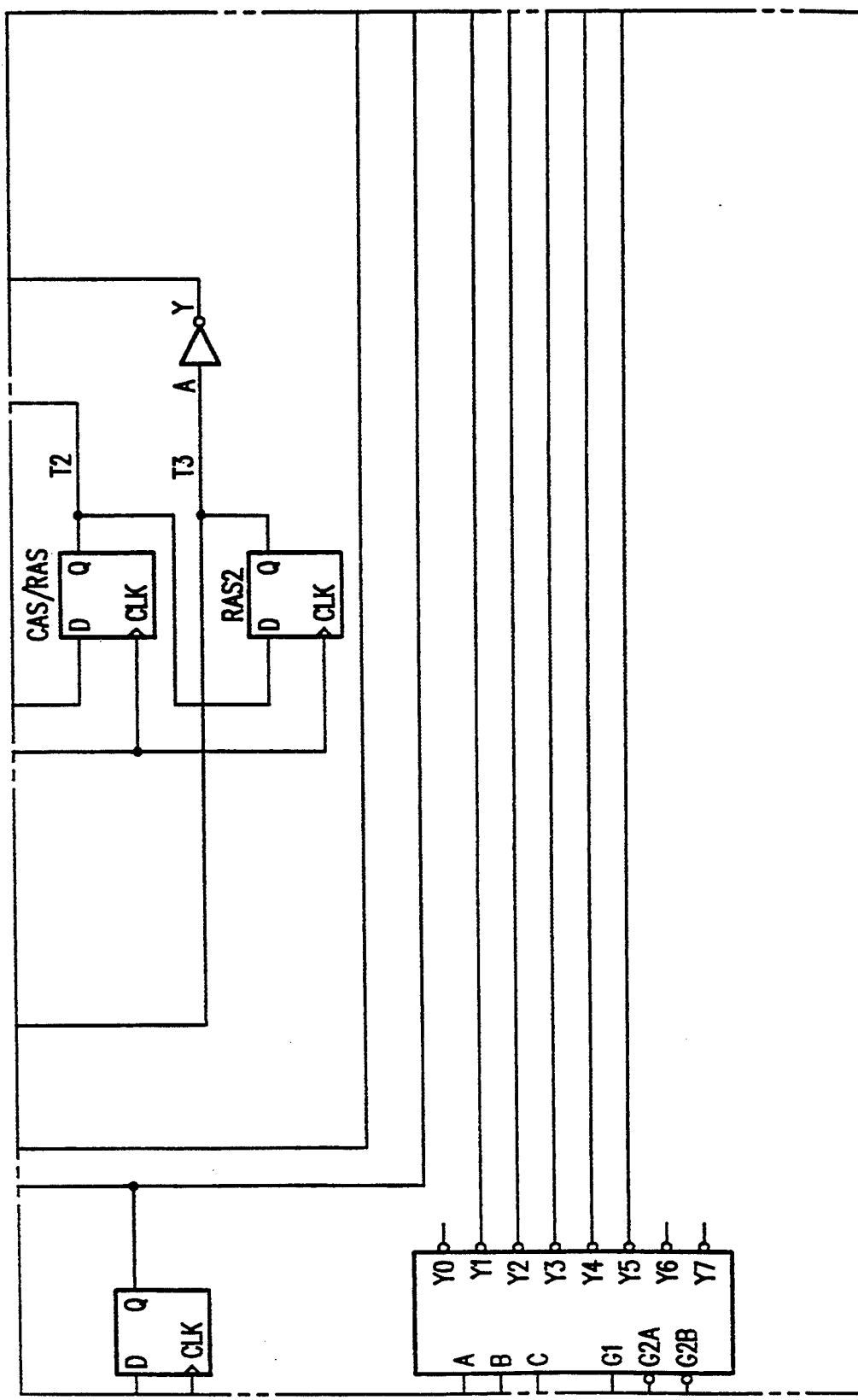
FIG. 2C(8)

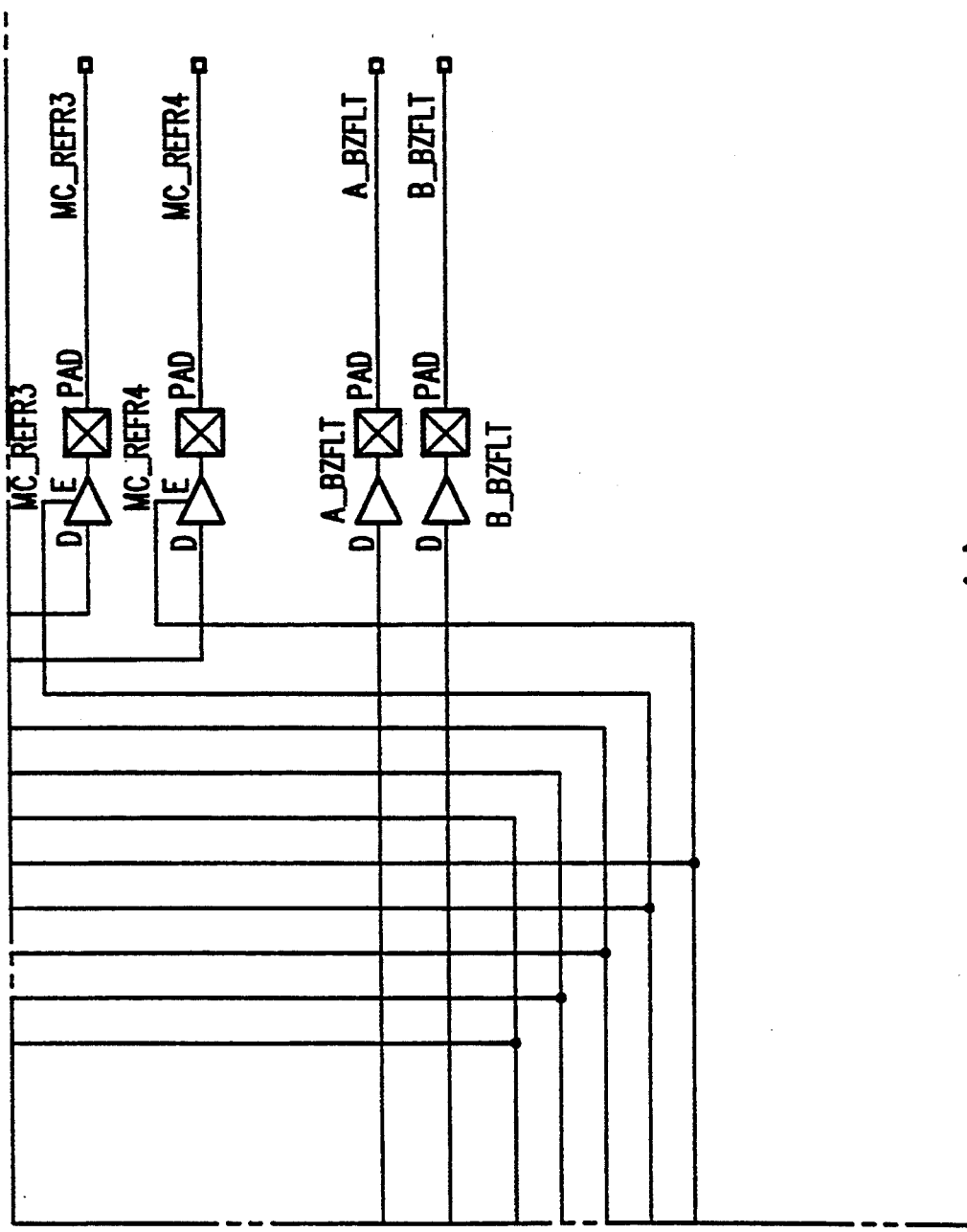
FIG. 2C(9)

FAULT TOLERANT MEMORY SYSTEM

BACKGROUND

This invention pertains to memory systems, particularly memory systems which provide fault tolerance.

DESCRIPTION OF THE PRIOR ART

Fault tolerant memory systems are known in the prior art. Typically, a fault tolerant memory system utilizes two or three times the total amount of memory normally required, in order to allow for adequate redundancy to achieve fault tolerance. This results in a high cost. Other fault tolerant systems utilize a plurality of possessors, memories, and/or I/O units in order to provide redundancy, not just of the memory, but also of the CPU operation. Such a system is shown in International Patent Publication WO87/06037.

It has heretofore not been the case that fault tolerant memory systems were made utilizing less than at least twice the amount of memory required for basic system operation. Furthermore, prior art fault tolerant memory systems provide some level of fault tolerance with respect to errors in individual memory chip data storage and retrieval, but do not provide fault tolerance with respect to associated logic in the memory system, including data drivers, memory address circuitry, and the like.

A simple technique for achieving fault tolerance of a certain degree in memory systems is to use an Error Correction Code, wherein one or more bits are required to be added to each data word. Using a typical Hamming code as the ECC mechanism, for a 64 bit word 8 check bits are required in order to achieve a single-bit error correction. Similarly, for a 64 bit data word 14 or more check bits are required to achieve a double-bit error correction. A more sophisticated approach is to use two redundant memories of the size required for basic system operation, together with check bits. Thus, in such a system for a 64 bit word with 8 check bits, either memory can correct a single-bit error, and a two bit uncorrectable error can be detected in which case the alternate memory can be used. A still more sophisticated fault tolerant memory system is the Triple Modular Redundancy (TMR) system, in which case three completely separate memory systems, each with its own addressing circuitry are used, with each bit of a data word being read being voted best two out of three from each of the three memories.

In addition to the increasing cost with greater sophistication these prior art fault tolerant memories, certain types of errors are simply not addressed by these systems. For example, an error created during the propagation of an address bit to all of the redundant memories is not corrected by any of these prior art fault tolerant memories unless the entire address logic is also made redundant at an attendant increase in complexity and cost. Typical prior art TMR fault tolerant memories also do not address the problem of errors caused by the voting system itself. International Publication W087/06037 describes a triple redundant fault detection system which includes a diagnostic method for periodically evaluating the proper operation of the fault determination logic. However, this requires a specific diagnostic to be run, thereby disabling the system from its intended use while the diagnostic is run, thereby adversely affecting performance.

SUMMARY

In accordance with the teachings of this invention, a novel memory system is taught which provides redundancy, and thus error detection and correction capabilities. Unlike prior art redundant memory systems which largely replicate memory storage devices to provide redundancy at great cost, complexity, and power requirements, in accordance with this invention only a relatively small increase in memory device capacity is required to provide a high degree of error detection and correction. In accordance with this invention, data words are appended with error correction code words, which provide a first level of error detection and correction capability. Furthermore, memory addressing signals are made redundant in order to allow for fault tolerance during the propagation of address signals from a host CPU to the memory. Another level of fault tolerance is provided by utilizing redundant clocks which are maintained in synchronization, with voting circuits serving to select one of a plurality of matching clock signals for use in various parts of the system, thereby preventing a faulty clock from being used to the detriment of system performance. Yet another novel fault tolerance feature of this invention is achieved by dividing data bit storage into a plurality of modules, each having a bit size which is capable of being corrected by the error correction code being used. This allows hardware associated with address and data signals, including the voter associated with each memory module, to fail and valid data still be provided by the memory system due to the ability of the error correction code to correct data errors of at least the bit length associated with one memory module. In one embodiment, the error correction code and memory module size work together to provide error correction capability of two entire memory modules. In another embodiment, an additional single bit error is capable of being detected.

In one embodiment of this invention, redundant DRAM control signals are provided to the memory system, thereby assuring proper DRAM operation, including refresh. Voters are used to provide one set of DRAM control signals based upon matching redundant DRAM control signals. In one embodiment, redundant DRAM BUSY signals are used, with a voter providing a correct one of the DRAM BUSY signals, thereby providing proper DRAM refresh even in the event one of the redundant DRAM BUSY signals becomes faulty, such as stuck in the BUSY state.

In one embodiment, a plurality of memory controllers are used to access a single memory storage device. Each memory controller has its own supply voltage, each of which may be a redundant system, providing power to its memory controller even in the event one of its power supplies or AC supplies becomes defective. In one embodiment, the power supplies for each memory controller are used to provide redundant power to the memory storage device, providing increased fault tolerance with respect to power supply or AC power main failure.

In one embodiment of this invention, a continuous data scrub operation is performed, with data being written to the memory storage device together with ECC words for error correction. Simultaneously with this writing, the data and ECC code word are applied to a second ECC device which creates an additional ECC code word which is compared with the ECC code word which is written to the memory storage device with the data word. If the first and second ECC words match, no error has been detected. If they do not match, an error is detected, which can be attempted to be corrected by use of the ECC code, and corrected data is rewritten to the memory storage device, or appropriate corrective action taken to repair the defect which caused the error. By using a second ECC device for this purpose, this continuous error detection is performed in real time without degradation to system performance.

BRIEF DESCRIPTION OF THE DRAWINGS

FIG. 2a is a block diagram depicting one embodiment of the memory controllers of FIG. 2, together with their redundant clocks and redundant DRAM refresh circuitry;

FIG. 2b is a schematic diagram depicting one embodiment of a redundant clock circuit constructed in accordance with the teachings of this invention and suitable for use as one of the plurality of redundant clocks shown in FIGS. 2 and 2a;

FIG. 2c is a schematic diagram depicting one embodiment of a refresh controller suitable for use as refresh controller 1182 of FIG. 2b;

DETAILED DESCRIPTION

Figure 1:
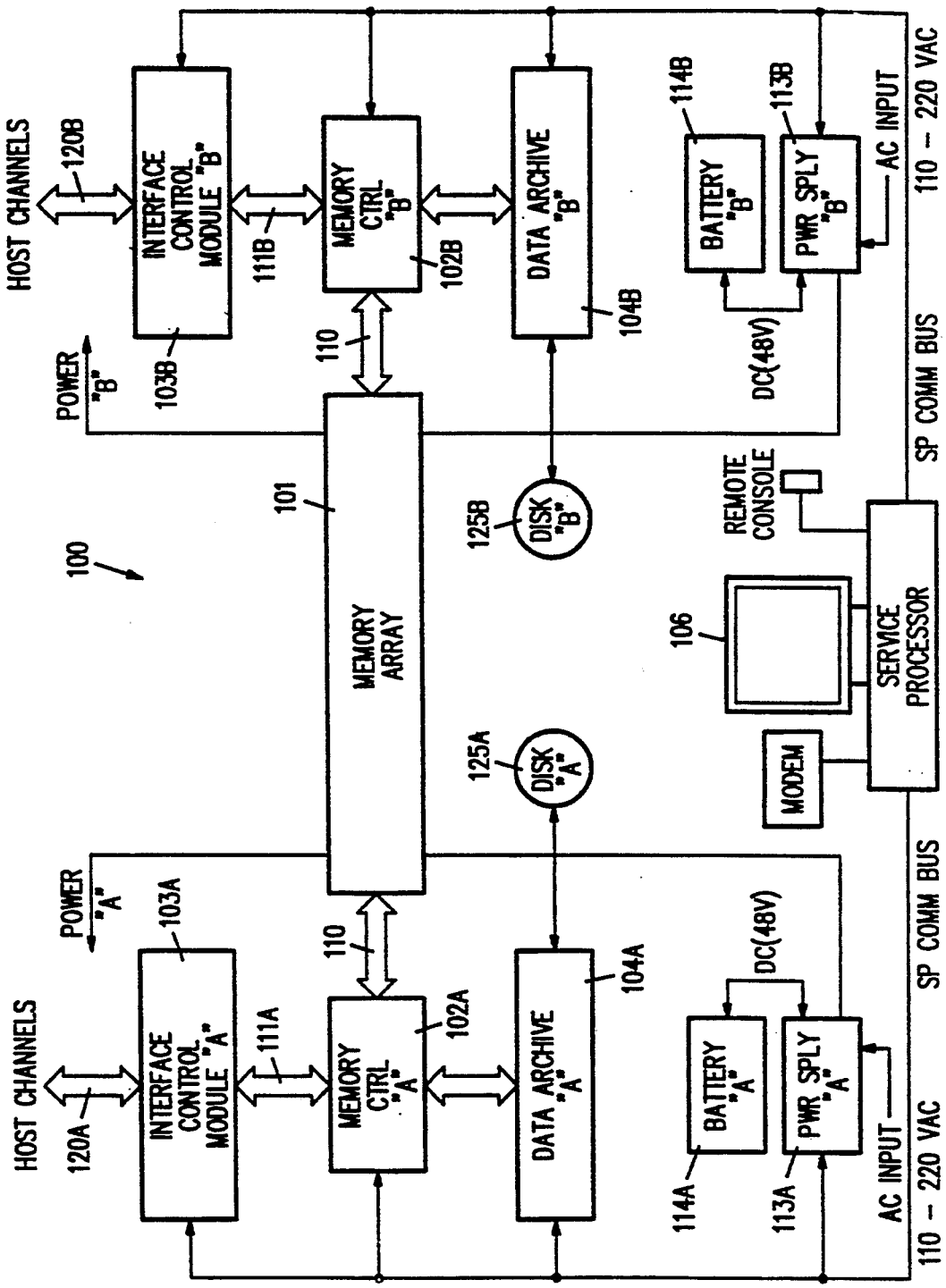
FIG. 1 is a block diagram depicting one embodiment of a memory system constructed in accordance with the teachings of this invention.

FIG. 1 is a block diagram of one embodiment of a memory system constructed in accordance with the teachings of this invention. Memory system 100 includes Memory Array 101 which is not required to be double or triple redundant, thereby saving a considerable amount of memory elements as compared with prior art double or triple redundancy systems. In one embodiment of this invention, Memory Array 101, including all the features required to provide significant fault tolerance, is approximately 20% larger than the memory size required for basic, nonredundant, system operations.

Memory system 100 includes Side A and Side B control interface circuitry 103A and 103B, each capable of communicating with one or more host CPUs via host Channel A and host Channel B, respectively, and Memory Array 101 via Memory Bus 110. Side A and Side B are, for convenience, identical and thus we will only describe the operation of Side A at this time.

Side A include memory controller 102A which operates to provide appropriate address and read/write control signals to Memory Array 101, as well as to communicate data with memory array 101 during reading and writing.

Side A also includes power supply 113A which receives, for example, line voltage, and provides appropriate DC voltage requirements to Memory Array 101 and the remaining circuitry of Side A. Battery 114A is charged by power supply 113A and provides DC power to Memory Array 101 and the circuitry of Side A in the event of a failure of power supply 113A or its line voltage. In one embodiment, power supply 113A comprises two separate power supplies so that in the event one fails, the second is automatically switched into service without transient voltages, thereby allowing Side A to continue operating. Furthermore, if desired, the failed power supply can provide an indication of its failure to service processor 106 thereby flagging a technician of the need to replace the failed power supply.

Data archival circuitry 104A allows data to be transferred, via Memory Controller 102A, between Memory Array 101 and nonvolatile storage media 125A (such as one or more disc or tape units). This feature allows for periodic archival of data from Memory Array 101 to a nonvolatile storage media. This also allows for such archival in the event of a complete failure of power supply 113A or of the AC line voltage, during the time in which battery 114A contains enough power to allow Side A to continue operating to complete the memory operation in process, and to archive data to nonvolatile. Storage media 125A. In the event archived data is required to be placed into memory array 101, for example after an archival operation due to a complete failure of power supply 113A, data is transferred from mass storage unit 125A to memory array 101.

Interface Control Module 103A provides an interface between Host Channel 120A and Memory controller interface bus 111A. Interface Control Module 103A serves to provide compatibility between a host communicating via host channel 120A and Memory controller interface 111A. For example, if a host wishes to communicate to a disk using the IBM 3990 standard, interface control module 103A will emulate the IBM 3990 standard while providing appropriate control signals to Memory controller interface 111A. In the event that the host is compatible with the control signals required to communicate with Memory controller interface 111A, interface control module 103A is not needed.

Figure 2:
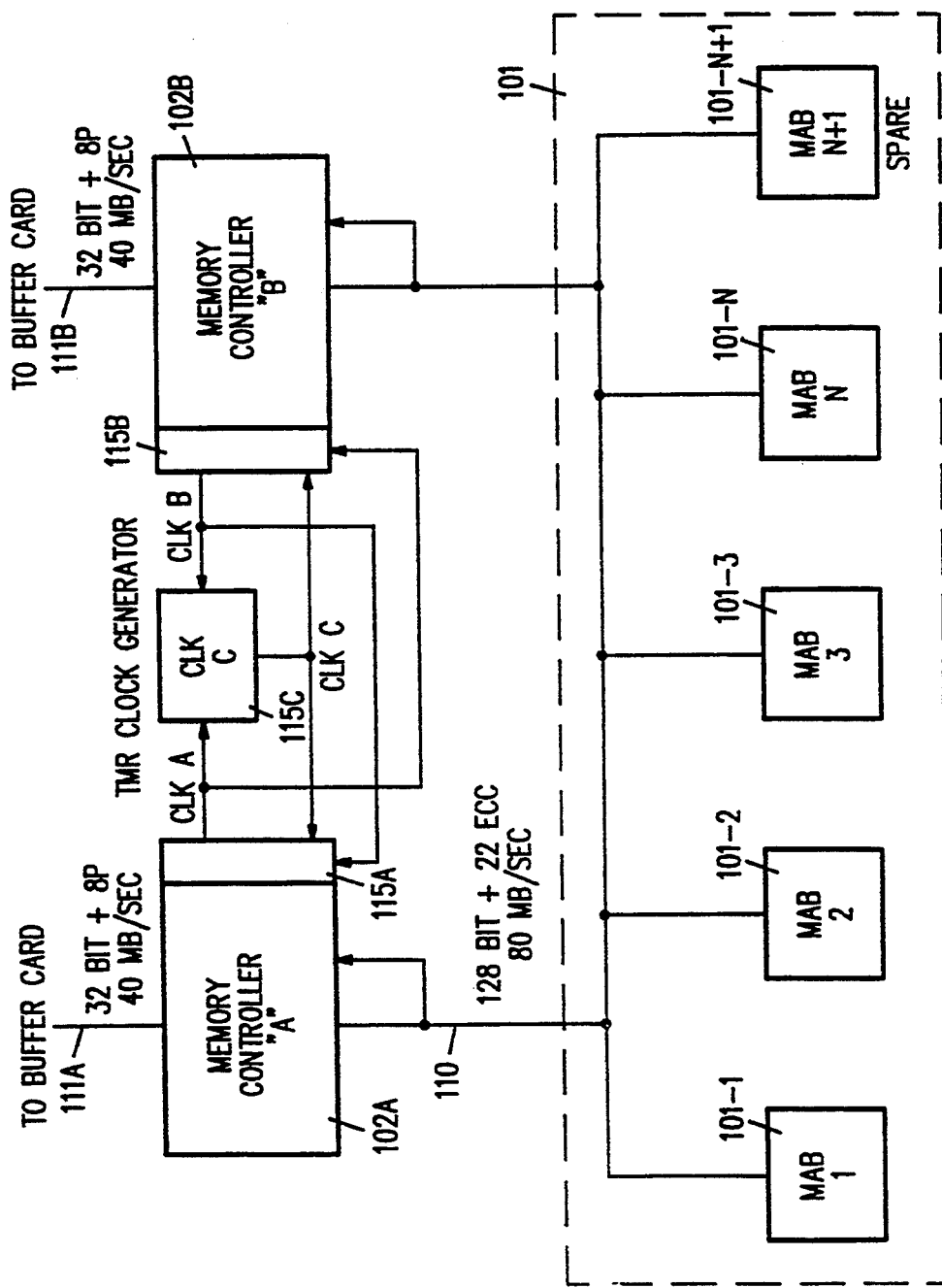
FIG. 2 is a block diagram of one embodiment of a pair of memory controllers and their use of redundant clocks, in accordance with the teachings of this invention.

FIG. 2 is a block diagram depicting one embodiment of Memory Array 101 as controlled by Memory Controllers 102A and 102B. Memory Array 101 includes Memory Array Boards 101-1 through 101-N, and spare Memory Array Board 101-N+1. One level of redundancy is achieved by utilizing two memory controllers. Thus, in the event Memory Controller 102A fails, Memory Controller 102B is still available. In one embodiment N=4, and each memory array board comprises one gigabyte, arranged as 64M words, each word having 130 data bits and 20 ECC bits. In one embodiment, these 150 bits are arranged in thirty groups of 5 bits. The 20 error code bits allow any two groups of five bits to fail (i.e. a maximum of ten failed bits between two groups), while allowing proper on-the-fly error correction. Alternatively, a single five bit group can fail, together with another single bit error, with all of these errors being correctable by the ECC. Since the memory modules were selected to be of five bits in width, two memory modules may fail completely and still have their ten data bits corrected by the unique error correction code of this invention. This allows two memory modules to fail for any reason whatsoever, including failures in address information applied to the "failed" memory modules. It will be appreciated to those of ordinary skill in the art in light of the teachings of this invention that other numbers of error code bits can be used to provide a desired level of error detection and correction for given memory module sizes, without departing from the spirit of this invention.

Spare Memory Array Board 101-N+1 is used as replacement when a standard Memory Array Board 101-1 through 101-N is determined to have uncorrectable errors, or correctable errors exceeding a predetermined threshold level. In one embodiment, a simple algorithm is used to cause the error logger to track the number of "hard error" bits (i.e. bits which are permanently in error due to a hardware defect, rather than a "soft error" in which a properly functioning bit storage area stores an incorrect logic state due, for example, to alpha particle hits) that have occurred on a single memory array board 101-1 through 101-N. In this embodiment, if two or more hard errors have occurred on a single memory array board, a hot swap operation is initiated to place data from the defective memory array board to the spare memory array board 101-N+1. Upon completion of the hot swap operation, the defective memory array board is logically replaced with the spare memory array board 101-N+1, with the defective memory array board now serving as the spare memory array board in the event another one of the memory array boards becomes more defective than the logically replaced defective memory array board prior to the physical replacement of the defective memory array board.

This allows spare Memory Array Board 101-N+1 to be swapped on the fly without performance penalty and prior to the defective memory array board becoming so defective as to have uncorrectable errors. Upon such occurrence, service processor 106 (FIG. 1) preferably calls the service organization indicating a memory board needs to be replaced at a convenient service time, while in the meantime spare Memory Array Board 101-N+1 is hot swapped with the bad Memory Array Board. This hot swap may be accomplished in the following manner. First, service processor 106 will determine that a good spare board 101-N+1 exists and is available as a replacement for the bad Memory Array Board. Service processor 106 then sends a command to memory controller 102A and memory controller 102B to perform all of their writes to the failed Memory Array Board in parallel with writes to the replacement memory Array Board 101-N+1. Then service processor 106 instructs either memory controller 102A or memory controller 102B to perform a read, correct, and restore operation for all data locations within the failed Memory Array Board. This, due to the previous instruction to write data in parallel to the spare Memory Array Board 101-N+1, will cause the spare Memory Array Board 101-N+1 to become filled with valid data, at which time service processor 106 instructs memory controllers 102A and 102B to cease accessing the failed Memory Array Board and access spare Memory Array Board 101-N+1 in its place.

Clock 115A is one of three clocks contained in the system for maintaining redundancy and clock synchronization. Clock 115A controls the timing of the various registers contained in Memory Controller 102A. Clock Circuit 115A operates as a signal-controlled clock which is synchronized to identical Clock Circuits 115B and 115C (FIG. 2). Clock 115A provides to Memory Controller Board 102A CLKA, CLKB, CLKC clock signals (generated by clock circuits 115A, 115B, and 115C, respectively), as well as a voted clock signal which provides an accurate clock signal in the event one of the three clock signals fails. Within Memory Controller Board 102A, for circuits which are triplicated for TMR purposes, each of the three triplicated circuits receive one of clock signals CLKA, CLKB, CLKC. For those circuits which are not triplicated within Memory Controller 102A, the voted clock is used.

FIG. 2a is a block diagram depicting one embodiment of a triple modular redundant refresh system constructed in accordance with the teachings of this invention. The redundant refresh circuitry of this invention functions to synchronize three independent refresh circuits in a single refresh timer and allows the refresh circuitry to operate when one of the three independent refresh circuits is defective or removed for repair or replacement. Memory controller 102A includes clock 115A, memory controller 102B includes clock 115B, and clock 115C is used to provide the third of the triple modular redundant clocks, as discussed above with reference to FIG. 2. Associated with clock 115C is one of three TMR refresh generators 1201C, with the other two TMR refresh generators 1201A and 1202b being formed as part of memory controllers 102A and 102B, respectively. Clock 115C feeds its clock signal to refresh counter 1203 and refresh state machine 1202 of refresh generator 1201C. The clock signal from clock 115C is also applied to clocks 115A and 115B, and clock 115C receives clock signals from clocks 115A and 115B, as described above to provide voted clocks as needed. Refresh counter 1203 serves to maintain a count indicative of when refresh should take place. The output signal from refresh counter 1203 is applied to refresh generators 1201A and 1201B, and refresh counter 1203 receives a refresh count signal from refresh generators 1201A and 1201B. In each refresh generator 1201A, 1201B, and 1201C, a voter such as voter 1204-3 performs a two out of three vote of the three refresh counter signals, with the voted result being applied to refresh counter 1203 in order to determine the proper interval between refreshes, and to refresh state machine 1202 in order to provide refresh request and refresh RAS and refresh CAS signals that are synchronized with the other two refresh circuits. Memory controllers 102A and 102B each include A, B, and C timing generators 1205A,1206A; 1205B,1206B; and 1205C,1206C, respectively. Each timing generator within each memory controller 102A, 102B receives one of the three clock signals, and provides triplicated busy signals from the memory timing generators indicating that a refresh is not to be performed at this time. These busy signals are voted on by voters 1204-1 and 1204-2 within refresh generators 1201A, 1201B, and 1201C to provide a triple redundant voted indication of whether memory controllers 102A and 102B are busy. Each refresh memory generator provides triple redundant REFRESH REQUEST, REFRESH RAS, and REFRESH CAS signals, which are applied to the memory array boards 301-1 through 301-60, as is described below with reference to FIG. 3.

FIG. 2b is a schematic diagram of one embodiment of a triple redundant clock system constructed in accordance with the teachings of this invention. Clock circuit 115C receives a clock signal CLKA and CLKB from clock circuits 115A and 115B, and provides a clock signal CLKC to clock circuits 115A and 115B, as described above with reference to FIG. 2. Each clock circuit 115A, 115B, and 115C provides a clock signal synchronized with the other two clocks. This assures two synchronized clocks will be available, even if one of the three redundant clocks fail. This allows a voted clock signal to be provided based on a vote of two of the three clock signals, ensuring a reliable clock signal even in the event one of the three clock signals is faulty. Clock signals CLKA and CLKB are applied to AND-/OR circuit 1151, as is CLKC. AND/OR circuit 1151 provides a single voted output signal to drive the clock circuitry of clock circuit 115C, which is applied to inverter 1152. The output signal of inverter 1152 is applied to one side of crystal Y1, which is bypassed to ground by capacitors C1 and C2. The other side of crystal Y1 is coupled via resistor R1 to the voltage divider formed by resistors R2 and R3, which serves to establish a known fixed output voltage level in the event clock circuit 115C fails. This provides a definitive error condition, which can be detected with certainty. Resistor R1 establishes the symmetry of the CLKC signal, in order to provide a desired duty cycle of approximately 50%. The output side of resistor R1 is also coupled to diode CR3 which is coupled in series with capacitor C3 to ground. Diode CR3 and capacitor C3 serve to ensure that clock circuit 115C begins to oscillate when powered up. The output side of resistor R1 is also coupled to inverter 1153, which provides a buffered CLKC output signal. This CLKC output signal is also applied to inverters 1155A, 1155B, and 1155C to provide clock signals 40NSCLKA, 40NSCLKB, and 40NSCLKC to AND/OR circuit 11161, which provides a voted two of three output signal to clock divider circuit 1181 which provides output signals 80NSCLKA and 80NSCLKB and 160NSCLKA and 160NSCLKB for internal controller timing. Refresh controller circuit 1182 serves to generate the refresh time period (e.g. approximately 16 microseconds), determine if the memory controllers are busy performing a memory cycle, generate the control signals (such as refresh RAS, CAS, etc) to perform a refresh cycle, and synchronizes the refresh counters of the other two redundant refresh/clock circuits. One embodiment of a refresh controller circuit 1182 is shown in the schematic diagram of FIG. 2c.

Figure 3:
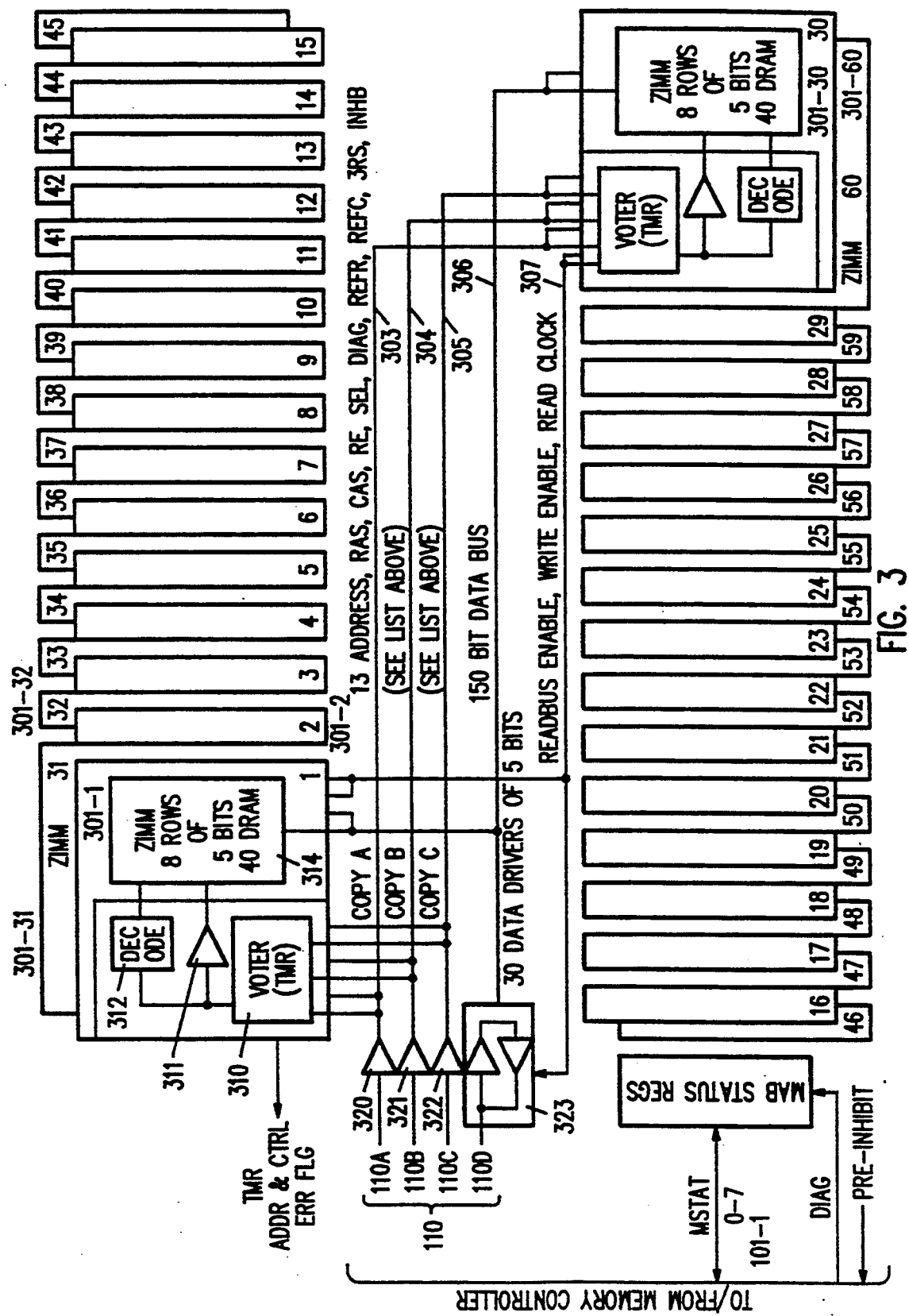
FIG. 3 is a block diagram depicting one embodiment of a memory array board constructed in accordance with the teachings of this invention.

FIG. 3 is a block diagram of one embodiment of a memory array board suitable for use as Memory Array Board 101-1 (FIG. 2), with the other memory array boards being of similar construction in this exemplary embodiment. Memory Array Board 101-1 includes, in this embodiment, 60 memory modules 301-1 through 301-60. Each memory module includes DRAM Memory 314 organized as eight rows by five bits, utilizing forty DRAMs each of four megabytes. Each pair of memory modules (e.g. Memory Modules 301-1 and 301-31) are cascaded into Bank 0 and Bank 1 addresses in order to provide sixteen rows of five bits per DRAM. It will be appreciated by those of ordinary skill in the art in light of the teachings of this invention that the specific memory size, organization, and DRAM sizes used are capable of a wide variation depending on specific applications and desires, and the configuration described in this specification is by way of example and not to be construed as a limitation of the scope of this invention.

The operation of memory modules 301-1 through 301-60 are now described with reference to memory module 301-1. In one embodiment, Memory Bus 110 provides three copies of the following signals on redundant busses 110A, 110B, and 110C, which form part of memory controller bus 110:

| 13 | ADDR | address lines |
|---|---|---|
| 3 | RSEL | DRAM row select lines |
| 1 | RAS | DRAM row address strobe |
| 1 | CAS | DRAM column address strobe |
| 1 | REFC | Refresh CAS |
| 1 | RE | Read Enable |
| 1 | INH | Inhibit Signal |
| 1 | BSEL | Board Select |
| 1 | REFR | Refresh RAS |
| 1 | ZOL | Bank Select |
| 1 | DIAG | Diagnostic bit |
| 1 | PREINH | Preinhibit |

The 13 address bits will support up to 64 Megabit DRAM chips. These three copies are provided on busses 110A, 110B, and 110C, respectively, to each Memory Module 301-1 through 301-60 and are received in each memory module by TMR Voter 310. Voter 310 performs a two-out-of-three vote on each of these address and control bits in order to provide an error-corrected set of address and control bits to Decoder 312, as well as a single bit ZOL signal to select either Bank Zero (e.g. Memory Module 301-1) or Bank One (e.g. Memory Module 301-31). Address Buffer 311 provides the remaining address bits to select the appropriate DPAM within Memory 314. As will be more fully described later, a unique error correction code is utilized in conjunction with the deselected width of data stored with in each memory module such that the unique error correction code is capable of detecting and correcting at least one complete failure in any one memory module. In one embodiment, the unique error correction code is capable of correcting complete (i.e. 5 bit) failures in two memory modules, and detect many instances of yet another single bit error in another memory module. Obviously, this embodiment also allows correction of any 5 bit error and correction of any possible simultaneous single bit error. In this manner, the unique error correction code, used in conjunction with memory array modules of appropriate size, allows Voter 310 to correct any error in any of the 23 address and memory control bits, which errors may have occurred anywhere in the path from their generation at either Memory Controller 102A or Memory Controller 102B (FIG. 1) through all circuitry and signal paths to Voter 310. This path includes, for example, the backplane in memory board address drivers 320, 321, 322, board connectors, and other buffer/drivers (not shown) which may be required or desired between the Memory Controller 102A or 102B and Voter 310. Precharge inhibit signal PREINH serves to tell a memory array board that it should cease operation after completing its current task, following which the INH inhibit signal is generated by the memory controller in order to inhibit all operations on that memory array board, allowing it to be physically replaced. In an alternative embodiment of this invention, physical pins of appropriate length with respect to the length of other pins of the memory array boards are used to generate an inhibit signal during the physical removal/replacement of a memory array board, as is known in the art.

In addition to the triplicated signals indicated above, Memory Bus 110 also provides a nonredundant set of signals to each memory array board, as follows:

| 8 | Status [0:7] | Status bits |
|---|---|---|
| 1 | TMREA | TMR Address Error Flag |
| 1 | TMREC | TMR Controller Error Flag |
| 1 | GNDP | Precharge Ground |
| 1 | VCCAP | current limited precharge VCCA |
| 1 | VCCBP | current limited precharge VCCB |
| 1 | VCCA | VCCA |
| 1 | VCCB | VCCB |

VCCA (and VCCAP) are supply voltages provided by power supply 113A (FIG. 1) and VCCB (and VCCBP) are supply voltages provided by power supply 113B (FIG. 1). The precharge supplies VCCAP and VCCBP and precharge ground GNDP are applied to each Memory Array Board 101-1 through 101-N+1 via longer pins so that during the insertion of a memory array board into a powered up system, the precharge voltages are applied to the memory board prior to data signals, to prevent erroneous signals on the data bus, and prior to supply voltages VCCA and VCCB, to prevent undesirable transitions on the power supply bus. In one embodiment, precharge voltages VCCAP and VCCBP are current limited by a resistor of approximately 0.5 ohms, allowing the memory array board being inserted to be rapidly precharged without creating noise.

Voter 310 puts out three control signals to its associated one 323-1 of the 30 Data Transceivers 323 (transceiver 323-1 being associated with the five data bits of its associated pair of Memory Modules 301-1;301-31) which, in one embodiment, is a 74FCT646 device available from Quality Semiconductor, Inc. These three control signals are the READBUS ENABLE, which serves to allow data to be transferred between bus 110 and memory array board 101-1, WRITE ENABLE, which serves to disable memory array board 101-1 when another memory array board is being accessed, thereby preventing data switching within memory array board 101-1 to reduce power consumption, and READ CLOCK, which serves as a data strobe signal indicating valid data is available during a read cycle of memory array board 101-1. As shown in FIG. 3, each pair of memory modules 301-1 through 301-60 has an associated data transceiver 323-1 through 323-30, respectively, so that 150 data bits are communicated in parallel on bus 110D. In this manner, if voter 310 fails, it only affects its five data bits which, as previously mentioned, is correctable as the 150 data bits are organized into thirty groups of five bits, failures in any two of which are correctable. In one embodiment, voter 310, address buffer 311, and decoder 312 are formed as part of a single integrated circuit 312, such as an ASIC.

Figure 3A:
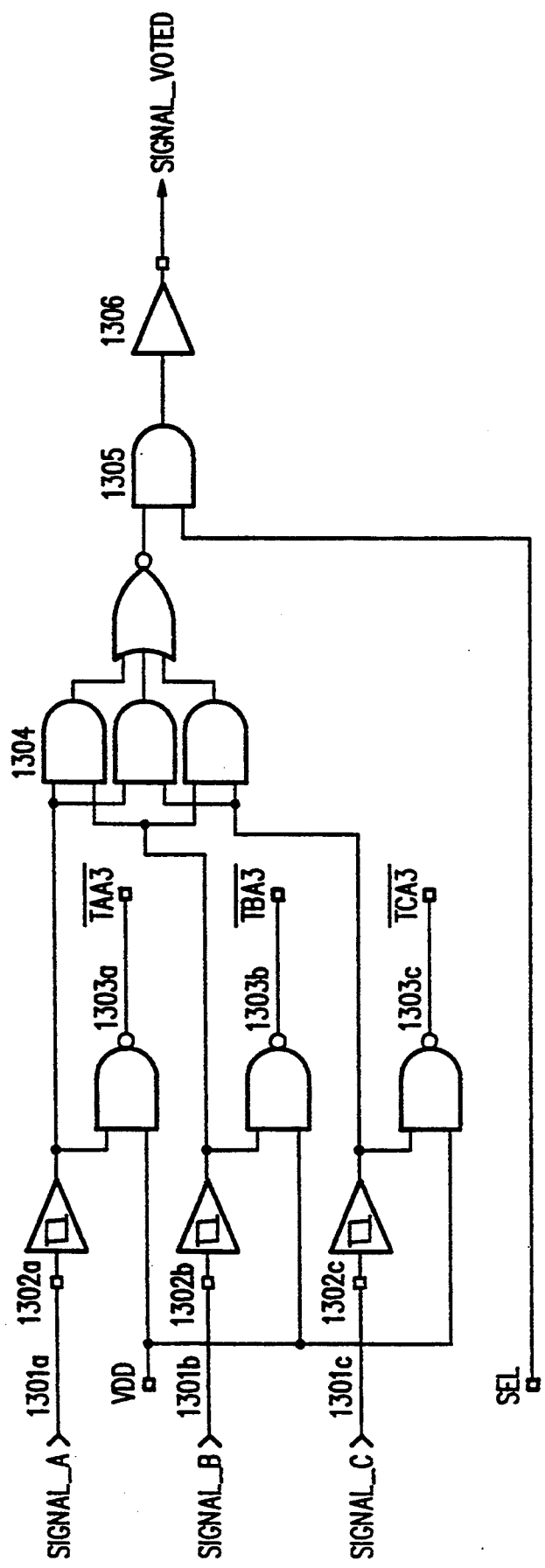
FIG. 3a is a schematic diagram depicting one embodiment of a voter circuit of this invention suitable for use as voter 310 of FIG. 3.

One embodiment of a portion of a voter circuit suitable for providing a two-of-three vote on a single set of triple redundant input signals is depicted in FIG. 3a. The three redundant input signals are labeled SIGNAL-A, SIGNAL-B, and SIGNAL-C, received on input leads 1301A, 1301B, and 1301C, respectively. Each input signal is applied to the input lead of a Schmitt Trigger 1302A, 1302B, and 1302C, whose output signal is applied to one input lead of NAND gate 1303A, 1303B, and 1303C, respectively. The other input leads of NAND gates 1303A, 1303B, and 1303C are coupled to a logical one signal (VDD), so that the NAND gates operate as inverters to provide an intermediate output signal for testing purposes or other uses as may be desired. The output signals of Schmitt Triggers 1303A, 1303B, and 1303C are applied to AND/NOR gate 1304, which provides a two-of-three voting selection. The output of AND/NOR gate 1304 is applied to masking AND gate 1305, which gates the voted output of AND/NOR gate 1304 based on the select signal (for example, the select signal used to select the appropriate one of each pair of memory modules, such as pair 301-1, 301-31, as described above with respect to FIG. 3). This gated signal is applied to inverter 1306, which in turn provides a gated, voted copy of the triple redundant input signals.

Figure 4:
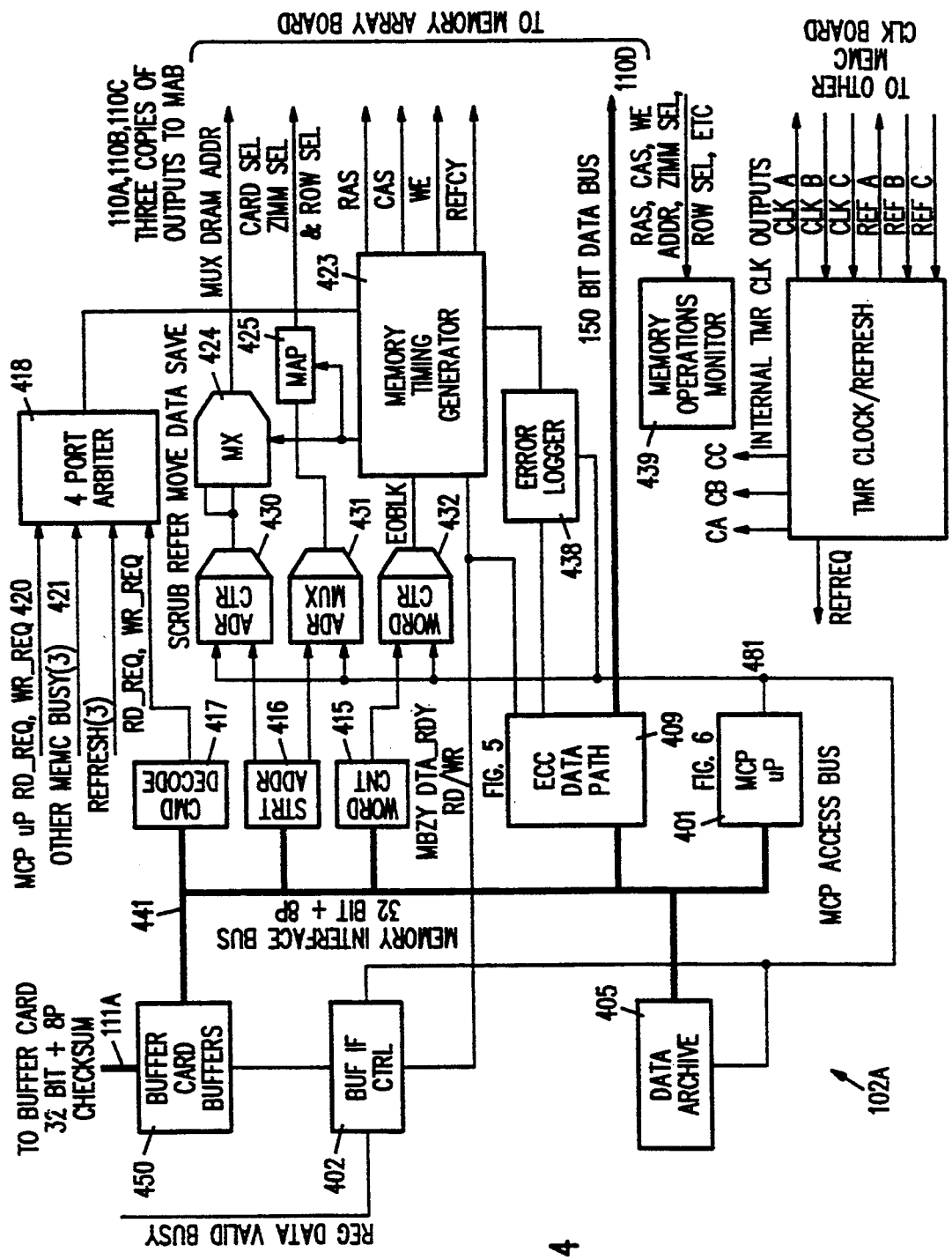
FIG. 4 is a block diagram depicting one embodiment of a memory controller of this invention suitable for use as memory controller 102A of FIG. 2.

FIG. 4 is a block diagram depicting one embodiment of Memory Controller 102A, as previously described with reference to FIG. 2. A memory operation of Memory Controller Board 102A will now be described. Buffer 450 communicates via Bus 111A with a host in a block mode fashion. During a read operation, for example, a first load of buffer 450 is initiated by the host to load operation code ("op code") and a word count defining the number of words to be read from Memory Array 101 via Memory Controller Board 102A. If desired, parity bits can also be used during this first load; A second load transfers a start address of 32 bits plus, if desired, 8 bits of parity. This provides sufficient information for Memory Controller Board 102A to perform a block read from the start address for the number of words specified in the word count. By utilizing eight parity bits, rather than the more traditional four bit parity for a 32 bit word, error detection on any combination of 8 bits is accomplished as opposed to simply odd or even parity detection. Memory Controller Board 102A then provides a series of data transfers to the host in order to transfer the block of data beginning at the starting address and continuing for the specified word count. During writing, this operation is reversed so that the host computer provides a block of data to be stored in memory at the starting address through the specified word count.

Following the first and second loads during a memory operation, buffer 450 temporarily stores the data for routing to Word Count Register 415. The start address is stored in Start Address Register 416, and the op code is stored in Command Decode Register/Decoder 417. Four Port Arbiter 418 receives input signals defining when Memory Bus 110 is available to Memory Controller Board 102A. Four Port Arbiter 418 receives input signals from Microprocessor 401, Command Decode Register/Decoder 417, and composite signals on leads 420 and 421 from Memory Controller Board 102B (FIG. 1) which shares Bus 110 with Memory Controller Board 102A. The composite signal received on lead 420 indicates when memory controller board 102B is performing a memory operation such as a soft error scrub, refresh, data move, or data saving operation. Lead 421 receives signals from Memory Controller 102B indicating when Memory Controller 102B is performing a read request or a write request to Memory Array 101. In any of these cases, Memory Controller 102B has gained access to Memory Bus 110 and thus Memory Bus 110 is unavailable to Memory Controller 102A.

The output bus from Command Register/Decoder 417 indicates to Four Port Arbiter 418 when Memory Controller 102A is performing a read request or a write request is desired by Memory Controller 102A. Similarly, Microprocessor 401 provides signals to Four Port Arbiter 418 indicating when Microprocessor 401 wants to perform certain operations such as scrub, refresh, data move, and data save. The refresh signal is triplicated, with copies generated by the clock board, memory controller A, and memory controller B, as described above. Four Port Arbiter 418 arbitrates these various input signals and provides an output signal to Memory Timing Generator 423 (which includes clock 115a, timing generators 1205a,b, and c, and refresh generator 1201a of FIG. 2a) indicating whether Memory Controller 102A will be granted access to Memory Bus 110. Memory Timing Generator 423 in turn controls Address Counter Multiplexer 424 and Memory Mapping Circuit 425 pertaining to availability of Memory Bus 110. Memory Array Mapping Circuit 425 serves to map addresses to an appropriate Memory Array Board 101-1 through 101-N (FIG. 2), thereby allowing different memory sizes to be used in the various memory array boards, if desired. In one embodiment Memory Array Map Circuit 425 is a PROM configured by Microprocessor 401 as a lookup table in order to provide a quick map operation.

When Memory Bus 110 is available, Memory Controller 102A performs the desired memory operation. This is accomplished by loading the most significant bits of the start address stored in Start Address Register 416 into Address Multiplexer 431 which in turn are fed to Memory Array Mapping Circuit 425 as previously described. The least significant bits of the start address stored in Start Address Register 416 are transferred to Address Counter 430, which sequentially counts each memory operation in order to control the desired block of memory. The word count stored in Word Count Register 415 is transferred to Word Counter 432 which counts down to zero with each count of Address Counter 430 in order to determine when an end of block (EOBLK) signal should be generated when the entire memory block operation has been completed. This EOBLK signal is fed to Memory Timing Generator 423 which terminates the controller cycle, communicates to FIFO Buffer Controller 402 that the operation has been completed, and gives up Memory Bus 110.

In the event Four Port Arbiter 418 selects Microprocessor 401 as the device which will gain access to Memory Bus 110, Address Counter 430, Address Multiplexer 431, Word Counter 432, and Address Counter Multiplexer 424 operate to select their input signals from Microprocessor 401 rather than the signals available as input signals from buffer 450. In one embodiment, Four Port Arbiter 418 allows Memory Controllers 102A and 102B to operate in an interleaved fashion, for example, toggling between memory controllers 102A and 102B after 32 byte transfers, thereby enhancing latency among the various hosts.

ECC Data Path Circuitry 407 performs high level error correction of data flowing between Interface Bus 111A and Data 28 Bus 110D (which is the data lines of memory bus 110). Any desired error correction technique can be used. In one embodiment of this invention, a unique code as depicted in Table 1 is used. Novel features of this code include the use of relatively few error correction bits (simplifying hardware design and expense) while allowing the simultaneous correction of two groups of five bits, as well as allowing fast detection and correction of failed data bits by use of a table look-up memory.

A number of techniques have been used in the prior art to improve the reliability of data stored in memory systems. The simplest one has been to add a single parity bit to the data word to signify whether there is an even or odd number of "one" bits across the data word. The next level of complexity involves using a Hamming code which takes the data word and generates a "code word" (also known as check bits") representation of the data. This "code word" is appended to the data word and this combination then is stored in memory. The Hamming code has an advantage over the parity technique because it not only detected errors but is also capable of correcting a fixed number of errors. The most common implementation of this code in memory systems involves correcting a single bit error and detecting two bits in error in a single data word. The most complex codes are Reed-Solomon (R-S) error correction codes. These codes are more efficient in detecting and correcting multiple bit and "burst" type of errors in memory. These detection and correction properties are more applicable to data stored on magnetic media such as hard disks and floppy disks.

A unique error correction code is used in accordance with the teachings of this invention. This unique error correction code combines the properties of the straight Hamming code with the correction capabilities of the Reed-Solomon code. In accordance with one embodiment of this invention, this unique error correction code is structured such that it works on groupings of five (5) data bits, as in this implementation there are thirty groups of five bits for a total of 150 bits of information. Of these 150 bits of information, 130 bits are user data bits and twenty (20) bits are used for the error correction code word. One implementation of this unique code offers the ability to correct up to two groups of five bits (total of 10 bits) in the 150 bit memory word. In addition to correcting bits in any two 5 bit groups, it can also detect errors that are located in a third five bit group. In accordance with this invention, this unique error correction code can be modified to provide different combinations of error correction and detection depending on the reliability needs of the memory system.

Each of the twenty ECC "check bits" is generated by taking the "negative" parity of a unique combination of the user data bits. This generation of twenty "check bits" is performed by the ECC circuitry. Table 1 shows the combinations of the user bits that are used to generate each ECC "check bit".

TABLE 1

| Check Bit Data Bit | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|
| Data Bit (000) | X |   |   | X | X |   | X |   |   |   | X |   | X | X |   |   |   | X | X |   |
| Data Bit (001) |   | X |   |   | X |   | X |   |   | X |   | X |   | X | X |   |   |   | X | X |
| Data Bit (002) | X |   |   |   |   | X |   |   |   |   | X |   |   |   | X | X |   | X |   | X |
| Data Bit (003) |   | X |   |   |   |   | X |   |   |   | X | X | X |   |   | X | X | X | X |   |
| Data Bit (004) |   |   | X |   |   |   |   | X |   |   | X | X | X |   |   |   | X | X | X | X |
| Data Bit (005) | X | X | X |   | X |   | X | X |   | X | X | X |   |   |   | X | X |   |   |   |
| Data Bit (006) | X | X |   | X |   | X |   |   | X |   |   | X | X |   |   |   | X | X |   |   |

TABLE 1-continued

| Check Bit<br>Data Bit | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|
| Data Bit (007) |   | X | X |   | X |   | X |   |   | X |   |   | X | X |   |   |   | X | X |   |
| Data Bit (008) | X |   |   | X |   | X |   |   |   |   |   |   | X | X |   |   |   |   | X | X |
| Data Bit (009) |   | X |   | X |   | X |   |   |   | X |   |   | X |   | X | X |   | X |   | X |
| Data Bit (010) |   | X | X | X | X | X | X |   | X |   |   | X | X |   |   | X |   |   |   | X |
| Data Bit (011) | X |   |   | X | X |   | X | X |   | X |   |   | X | X |   | X |   |   |   |   |
| Data Bit (012) | X | X | X |   | X | X |   |   | X |   |   |   | X | X |   | X |   |   |   |   |
| Data Bit (013) | X | X |   | X |   | X |   |   | X | X |   | X | X |   | X |   |   | X |   |   |
| Data Bit (014) |   | X | X |   | X | X |   |   |   | X | X | X | X |   |   |   |   |   | X |   |
| Data Bit (015) | X |   | X | X |   | X | X | X |   |   |   |   |   | X | X | X |   |   |   | X |
| Data Bit (016) |   | X |   | X |   | X | X | X |   | X |   | X |   |   | X | X |   |   |   |   |
| Data Bit (017) |   | X |   | X |   |   | X | X | X |   | X |   | X |   |   |   | X | X |   |   |
| Data Bit (018) | X |   | X | X |   | X |   | X | X | X |   |   | X |   | X |   |   | X | X |   |
| Data Bit (019) |   | X |   | X | X | X | X | X | X | X |   | X | X |   |   |   |   |   | X | X |
| Data Bit (020) | X | X | X | X |   | X | X |   | X |   | X | X | X |   |   | X |   | X | X |   |
| Data Bit (021) |   | X | X | X | X |   | X | X |   | X |   | X | X | X |   |   | X |   | X | X |
| Data Bit (022) | X |   |   | X | X | X |   | X |   |   | X |   | X | X | X |   | X | X |   |   |
| Data Bit (023) | X | X | X | X |   | X |   |   | X | X | X | X |   | X |   | X |   | X | X | X |
| Data Bit (024) | X | X |   | X |   | X |   |   | X | X |   | X |   |   | X |   |   |   | X | X |
| Data Bit (025) |   | X | X | X |   | X |   | X | X |   |   | X |   | X |   |   | X | X |   |   |
| Data Bit (026) |   | X | X | X |   | X |   | X | X |   |   | X |   | X |   | X |   | X | X |   |
| Data Bit (027) | X |   | X | X | X |   | X |   | X |   |   |   | X |   |   | X |   | X | X | X |
| Data Bit (028) | X | X | X | X | X | X | X |   |   | X |   | X |   | X |   | X |   | X | X |   |
| Data Bit (029) | X | X |   | X | X | X | X | X | X |   | X |   | X |   | X | X | X | X |   |   |
| Data Bit (030) | X |   |   | X | X | X | X |   |   | X |   |   | X |   | X | X | X |   |   |   |
| Data Bit (031) | X | X | X |   | X | X | X |   |   |   |   |   |   | X |   | X | X |   |   |   |
| Data Bit (032) | X | X |   | X |   |   | X |   | X |   | X |   | X |   |   | X | X |   |   |   |
| Data Bit (033) |   | X | X |   | X |   | X | X |   | X |   | X |   | X |   |   |   | X |   | X |
| Data Bit (034) | X |   |   | X |   |   |   | X | X |   |   | X |   | X | X |   | X |   | X | X |
| Data Bit (035) |   | X | X | X | X | X |   | X |   |   | X | X | X |   | X |   |   | X | X | X |
| Data Bit (036) | X |   |   | X | X |   | X |   | X |   | X | X | X |   | X | X |   | X | X | X |
| Data Bit (037) | X | X | X | X |   | X |   | X |   | X |   |   | X | X |   | X | X |   | X |   |
| Data Bit (038) | X | X |   | X |   | X |   | X | X |   |   |   | X | X |   | X | X |   |   | X |
| Data Bit (039) |   | X | X |   | X |   | X |   | X | X | X |   | X |   | X | X |   |   | X |   |
| Data Bit (040) | X |   |   |   |   |   | X |   |   | X |   | X |   |   |   |   |   |   |   | X |
| Data Bit (041) |   | X |   |   |   | X |   |   |   |   |   |   | X |   |   | X |   | X |   |   |
| Data Bit (042) |   | X |   |   |   |   | X |   |   |   |   |   |   | X |   |   | X |   | X |   |
| Data Bit (043) |   |   | X |   |   |   | X |   |   |   |   |   |   | X |   |   | X |   | X |   |
| Data Bit (044) |   |   |   |   | X |   |   |   | X |   | X |   | X |   |   | X |   | X | X |   |
| Data Bit (045) | X |   |   |   | X | X | X |   | X |   | X |   |   | X |   | X |   |   | X |   |
| Data Bit (046) | X | X | X |   |   | X | X |   |   |   |   |   | X |   | X |   | X |   |   | X |
| Data Bit (047) |   | X | X | X |   | X | X |   |   | X |   |   | X | X |   | X |   |   |   |   |
| Data Bit (048) |   | X | X | X |   |   | X | X |   |   |   | X |   | X | X |   | X |   |   |   |
| Data Bit (049) | X |   | X | X | X |   | X | X | X |   |   |   | X |   | X |   |   | X |   |   |
| Data Bit (050) |   |   |   | X | X | X | X | X |   |   |   |   | X | X |   |   | X |   |   | X |
| Data Bit (051) | X |   | X |   |   | X | X | X | X |   |   |   | X | X | X |   |   |   |   |   |
| Data Bit (052) |   | X |   | X |   | X | X | X | X |   | X |   | X | X |   | X |   |   |   |   |
| Data Bit (053) |   | X |   | X | X | X | X | X | X | X | X | X | X | X |   |   |   | X |   |   |
| Data Bit (054) | X | X | X |   | X | X |   | X |   | X | X | X | X | X |   |   |   |   | X |   |
| Data Bit (055) | X | X | X |   |   | X |   | X |   |   | X |   | X |   | X | X |   | X | X | X |
| Data Bit (056) |   | X |   | X |   | X |   |   | X | X |   |   | X | X |   | X | X | X | X | X |
| Data Bit (057) |   |   | X |   | X | X | X |   |   | X |   |   |   | X | X | X | X |   | X |   |
| Data Bit (058) | X |   | X | X |   | X |   |   | X |   |   | X |   |   | X |   | X | X | X |   |
| Data Bit (059) |   | X |   | X | X |   | X |   |   |   | X | X | X |   |   | X |   | X |   |   |
| Data Bit (060) | X |   |   |   | X |   | X |   | X |   | X | X | X |   | X | X | X |   |   |   |
| Data Bit (061) |   | X |   |   | X |   | X |   | X |   |   | X | X | X |   | X | X | X |   |   |
| Data Bit (062) |   |   | X |   | X |   | X |   |   |   | X | X | X | X | X |   | X | X | X |   |
| Data Bit (063) |   |   |   | X |   | X |   | X |   |   | X | X | X | X | X | X | X | X | X | X |
| Data Bit (064) |   |   |   |   | X |   | X |   |   |   | X | X | X | X | X | X | X | X | X | X |
| Data Bit (065) | X | X |   |   | X | X | X |   | X |   | X | X | X | X |   |   | X | X |   |   |
| Data Bit (066) | X | X |   |   |   | X | X |   | X |   | X | X |   | X | X |   |   | X |   | X |
| Data Bit (067) |   | X | X |   |   | X |   | X |   |   | X | X |   | X |   |   |   |   | X | X |
| Data Bit (068) |   | X | X |   |   | X |   |   | X |   | X | X |   |   |   | X |   | X |   | X |
| Data Bit (069) |   |   | X | X | X |   |   | X | X |   | X | X |   |   | X | X | X | X | X |   |
| Data Bit (070) | X |   | X | X |   | X |   | X | X |   | X |   | X | X |   |   | X |   | X | X |
| Data Bit (071) | X | X | X |   | X |   |   | X | X | X |   |   | X | X | X | X |   | X |   |   |
| Data Bit (072) | X | X |   | X |   | X |   | X | X | X | X |   | X | X | X | X | X | X |   |   |
| Data Bit (073) |   | X | X |   | X | X | X | X | X | X | X | X | X | X |   | X | X | X |   | X |
| Data Bit (074) | X |   |   | X |   | X | X |   | X | X | X |   | X | X | X |   |   |   | X | X |
| Data Bit (075) | X | X |   | X |   | X |   |   |   |   |   | X |   | X | X |   | X |   |   | X |
| Data Bit (076) |   | X | X |   | X |   |   | X |   |   | X |   |   | X | X |   |   |   |   |   |
| Data Bit (077) | X |   |   | X |   |   |   |   | X |   | X | X | X |   |   |   | X |   |   |   |
| Data Bit (078) |   | X |   |   | X |   |   |   | X |   | X | X | X |   |   |   |   | X |   |   |
| Data Bit (079) | X |   |   |   |   | X |   | X |   |   |   |   | X | X | X |   |   |   | X |   |
| Data Bit (080) | X |   | X |   |   |   | X |   |   | X | X |   | X | X | X | X | X | X | X |   |
| Data Bit (081) |   | X |   | X |   | X |   |   |   |   | X | X |   | X |   | X | X | X |   | X |
| Data Bit (082) |   |   | X |   | X |   | X |   |   |   | X | X |   | X |   |   | X |   | X | X |
| Data Bit (083) | X |   | X | X |   |   |   | X |   |   |   | X | X |   | X | X | X |   |   | X |
| Data Bit (084) |   | X |   |   | X | X |   |   | X |   |   | X |   |   | X | X |   | X |   |   |
| Data Bit (085) | X |   |   | X |   |   | X | X |   |   |   |   | X |   |   | X | X |   |   |   |
| Data Bit (086) |   | X |   |   | X |   | X | X |   |   |   |   |   | X |   |   | X | X |   |   |

TABLE 1-continued

| Check Bit / Data Bit | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|
| Data Bit (087) | X |   |   |   |   |   |   |   | X | X | X |   | X |   |   |   |   |   | X | X |
| Data Bit (088) |   | X |   |   |   | X |   | X |   | X |   | X |   | X |   | X |   | X |   | X |
| Data Bit (089) |   |   | X |   |   | X | X | X | X |   |   |   | X |   | X | X | X | X | X |   |
| Data Bit (090) | X |   |   | X | X |   | X |   |   | X | X | X |   |   |   | X | X | X | X |   |
| Data Bit (091) | X | X | X |   | X | X |   | X | X |   |   | X | X |   |   |   | X | X | X | X |
| Data Bit (092) | X | X |   | X |   | X |   | X | X |   |   | X | X |   | X |   |   | X | X |   |
| Data Bit (093) |   | X | X |   | X | X |   |   |   | X |   |   |   | X | X | X | X | X |   |   |
| Data Bit (094) | X |   |   | X |   | X | X |   |   |   | X |   | X |   | X | X | X |   | X |   |
| Data Bit (095) | X |   |   | X |   |   | X |   | X | X |   | X | X | X |   |   |   | X | X | X |
| Data Bit (096) |   | X |   |   | X | X |   |   |   | X |   |   |   | X | X | X | X |   | X | X |
| Data Bit (097) | X |   |   |   |   | X | X | X |   |   | X |   |   | X | X | X | X | X | X | X |
| Data Bit (098) |   | X |   |   |   |   | X | X | X |   | X | X | X | X | X | X | X |   | X | X |
| Data Bit (099) |   |   | X |   |   |   |   | X | X | X | X |   |   | X | X | X | X |   |   | X |
| Data Bit (100) |   | X | X |   |   |   |   | X |   | X |   |   |   | X |   | X | X |   | X |   |
| Data Bit (101) |   |   |   | X | X |   |   |   | X |   |   |   |   |   | X |   | X | X |   | X |
| Data Bit (102) |   |   |   | X | X |   |   |   | X | X |   | X |   |   | X |   |   | X |   |   |
| Data Bit (103) | X |   | X |   | X | X |   | X |   |   | X |   | X |   |   | X |   |   |   | X |
| Data Bit (104) | X | X | X | X |   |   | X |   | X |   |   |   | X |   |   | X | X |   |   |   |
| Data Bit (105) |   |   | X |   |   | X | X |   |   | X |   |   |   |   | X | X |   | X | X | X |
| Data Bit (106) |   |   |   | X |   | X | X |   |   |   | X |   | X |   | X |   |   | X | X | X |
| Data Bit (107) |   |   |   |   | X |   | X | X |   | X | X | X | X |   | X |   |   | X | X | X |
| Data Bit (108) | X |   | X |   |   |   | X | X |   | X | X | X | X | X | X | X |   | X | X | X |
| Data Bit (109) |   | X |   | X |   |   |   | X | X | X |   |   | X | X | X | X |   |   | X | X |
| Data Bit (110) | X | X |   |   |   |   |   | X |   | X |   | X | X | X |   |   |   | X |   |   |
| Data Bit (111) |   | X | X |   |   | X |   | X |   |   | X |   |   | X |   |   |   |   |   | X |
| Data Bit (112) |   | X | X |   |   | X |   | X |   |   | X | X | X |   |   | X |   | X |   |   |
| Data Bit (113) |   |   | X | X | X |   |   | X |   | X |   | X | X | X |   |   | X |   | X |   |
| Data Bit (114) | X |   | X |   | X | X |   | X | X |   |   |   | X | X | X |   |   | X |   | X |
| Data Bit (115) |   | X |   | X | X |   | X |   | X |   |   |   | X | X | X | X |   | X | X |   |
| Data Bit (116) | X |   |   |   | X |   |   | X |   | X | X |   | X | X | X |   | X |   | X | X |
| Data Bit (117) | X | X | X |   |   | X |   | X | X | X | X | X | X | X | X |   |   |   |   | X |
| Data Bit (118) |   | X | X | X |   |   | X |   |   | X | X | X |   | X | X | X |   | X | X |   |
| Data Bit (119) |   |   | X | X | X | X |   |   |   | X | X | X |   |   | X |   |   | X | X | X |
| Data Bit (120) | X |   | X | X | X |   | X |   |   | X | X | X |   |   | X | X |   | X | X | X |
| Data Bit (121) | X | X | X | X | X | X |   |   |   | X | X |   | X |   |   | X | X | X | X | X |
| Data Bit (122) | X | X |   | X | X |   | X |   |   | X | X |   |   |   |   | X |   | X | X |   |
| Data Bit (123) | X | X |   |   | X |   | X |   |   |   |   |   | X | X |   | X | X |   |   | X |
| Data Bit (124) | X | X |   |   |   |   |   |   | X |   |   |   |   | X | X | X | X |   |   |   |
| Data Bit (125) |   |   | X | X |   | X | X | X |   | X | X |   |   |   | X | X |   |   | X | X |
| Data Bit (126) |   |   |   | X | X |   | X | X | X |   | X | X |   |   |   | X | X | X |   |   |
| Data Bit (127) | X |   | X |   | X |   |   | X | X | X |   | X | X |   |   | X | X |   | X |   |
| Data Bit (128) | X | X | X | X |   | X |   | X | X | X |   |   | X | X |   |   | X | X |   |   |
| Data Bit (129) |   | X | X | X | X | X | X | X | X |   |   |   |   | X | X | X |   |   | X |   |
| Data Bit (130) | X |   |   |   |   |   |   |   |   |   |   |   |   |   |   |   |   |   |   |   |
| Data Bit (131) |   | X |   |   |   |   |   |   |   |   |   |   |   |   |   |   |   |   |   |   |
| Data Bit (132) |   |   | X |   |   |   |   |   |   |   |   |   |   |   |   |   |   |   |   |   |
| Data Bit (133) |   |   |   | X |   |   |   |   |   |   |   |   |   |   |   |   |   |   |   |   |
| Data Bit (134) |   |   |   |   | X |   |   |   |   |   |   |   |   |   |   |   |   |   |   |   |
| Data Bit (135) |   |   |   |   |   | X |   |   |   |   |   |   |   |   |   |   |   |   |   |   |
| Data Bit (136) |   |   |   |   |   |   | X |   |   |   |   |   |   |   |   |   |   |   |   |   |
| Data Bit (137) |   |   |   |   |   |   |   | X |   |   |   |   |   |   |   |   |   |   |   |   |
| Data Bit (138) |   |   |   |   |   |   |   |   | X |   |   |   |   |   |   |   |   |   |   |   |
| Data Bit (139) |   |   |   |   |   |   |   |   |   | X |   |   |   |   |   |   |   |   |   |   |
| Data Bit (140) |   |   |   |   |   |   |   |   |   |   | X |   |   |   |   |   |   |   |   |   |
| Data Bit (141) |   |   |   |   |   |   |   |   |   |   |   | X |   |   |   |   |   |   |   |   |
| Data Bit (142) |   |   |   |   |   |   |   |   |   |   |   |   | X |   |   |   |   |   |   |   |
| Data Bit (143) |   |   |   |   |   |   |   |   |   |   |   |   |   | X |   |   |   |   |   |   |
| Data Bit (144) |   |   |   |   |   |   |   |   |   |   |   |   |   |   | X |   |   |   |   |   |
| Data Bit (145) |   |   |   |   |   |   |   |   |   |   |   |   |   |   |   | X |   |   |   |   |
| Data Bit (146) |   |   |   |   |   |   |   |   |   |   |   |   |   |   |   |   | X |   |   |   |
| Data Bit (147) |   |   |   |   |   |   |   |   |   |   |   |   |   |   |   |   |   | X |   |   |
| Data Bit (148) |   |   |   |   |   |   |   |   |   |   |   |   |   |   |   |   |   |   | X |   |
| Data Bit (149) |   |   |   |   |   |   |   |   |   |   |   |   |   |   |   |   |   |   |   | X |

In the general implementation of the memory system, a user data word (up to 130 bits) is sent to an error correction code (ECC) circuit, which can be conveniently provided as an ASIC, for example. This ECC circuit performs a series of logic operations on the 130 bit data word and forms a 20 bit error-correction code word. This code word is merged with the 130 bit user data to form a 150 bit memory word. This memory word is then written into the memory store, which is typically made up of a plurality of DRAM devices. Upon reading the memory word from the memory store, the 130 bit user data portion is sent to the ECC circuitry where a new error-correction code word is generated. This new error-correction code word is then compared with the 20 bit error-correction code which was read from the memory store. This comparison results in a code word containing what is referred to as 20 "syndrome bits". The syndrome bits are decoded and indicate the reliability status of the memory word read. There are three major status—1. no errors detected, 2. correctable errors, 3. detected, but not correctable errors. (Note: There is a small class of data errors which belong in "status 3" but are miscoded into classes 1 or 2.

The size of this class depends on the error-correction code).

Error Logger 438 receives signals from Memory Timing Generator 423 and ECC Data path circuitry 407 in order to correlate memory addresses with errors detected by ECC Data Path Circuitry 407 and to store this data in real time. The information stored in Error Logger 438 is available to Microprocessor 401 when requested by Microprocessor 401 to perform error analysis when time permits. Microprocessor 401 also serves to initiate a configuration, for example, by determining the size of memory array boards 101-1 through 101-N (FIG. 3) forming Memory Array 101, and programming Memory Mapping Circuitry 425 as required based upon memory array board sizes and number. Microprocessor 401 also serves to perform a memory scrubbing operation in which soft errors in the data stored in Memory Array 101 are determined and correctly rewritten. This is performed by reading addresses in Memory Array 101 sequentially and determining errors made evident by ECC Data Path Circuitry 407. In the event an error is determined, that error is corrected by ECC Data Path Circuitry 407 and that address location in Memory Array 101 is rewritten with the corrected data. These functions of Microprocessor 401 pertaining to service processor 106 includes the transfer of information to Service Processor 106 indicating errors detected in Memory Array 101 which cannot be corrected by Memory Controller Board 102A.

Microprocessor 401 also communicates to Service Processor 106 indicating when any other errors have been detected in Memory Controller 102A. This accomplishes two purposes. First, if the error is sufficiently detrimental to memory operation, hosts will be instructed not to access Memory Array 101 via Memory Controller 102A, and their memory operations will be rerouted through Memory Controller 102B (FIG. 1). Secondly, an operator is instructed to initiate repairs on Memory Controller 102A. In addition, Memory Controller 102A communicates to a host via status words upon each memory request initiated by the host as to the status of the memory operation, including uncorrectable errors for which the host may choose to cease accessing Memory Array 101 via Memory Controller 102A. As part of its configuration function, Microprocessor 401 also serves to Map from a Memory Array Board having a correctable error to the spare board, as has been previously described. Microprocessor 401 also performs diagnostics on Memory Controller 102A and Memory Array 101.

Microprocessor 401 also initiates a data save operation, for example, upon complete power failure, in which data stored in Memory Array 101 is transferred to non-volatile media 125A (FIG. 1). Microprocessor 401 also initiates the restore operation, for example, when power is restored, and data stored in non-volatile media 125A during the data save operation is to be replaced in Memory Array 101. Such data save operations may also occur, for example, when archival of memory array data is desired. Memory Operations Monitor 439 monitors the control signals on Bus 110 regardless of the source of these control signals (i.e. either Memory Controller 102A or Memory Controller 102B). This allows, for example, a table to be maintained of data which has been changed in Memory Array 101. This may be useful, for example, for allowing Memory Operations Monitor 439 to continually update the data stored in Non-Volatile Media 125A, for example providing a "trickle in" archival of data from Memory Array 101 to Non-Volatile Media 125A. This allows data to be continually updated to Non-Volatile Media 125A when Memory Bus 110 is available, without impairing memory performance. Thus, Memory Operations Monitor 439 maintains a list of addresses within Memory Array 101 which have been updated subsequent to their transfer to Non-Volatile Media 125A, thereby providing consistency between Memory Array 101 and Non-Volatile Media 125A.

Figure 5:
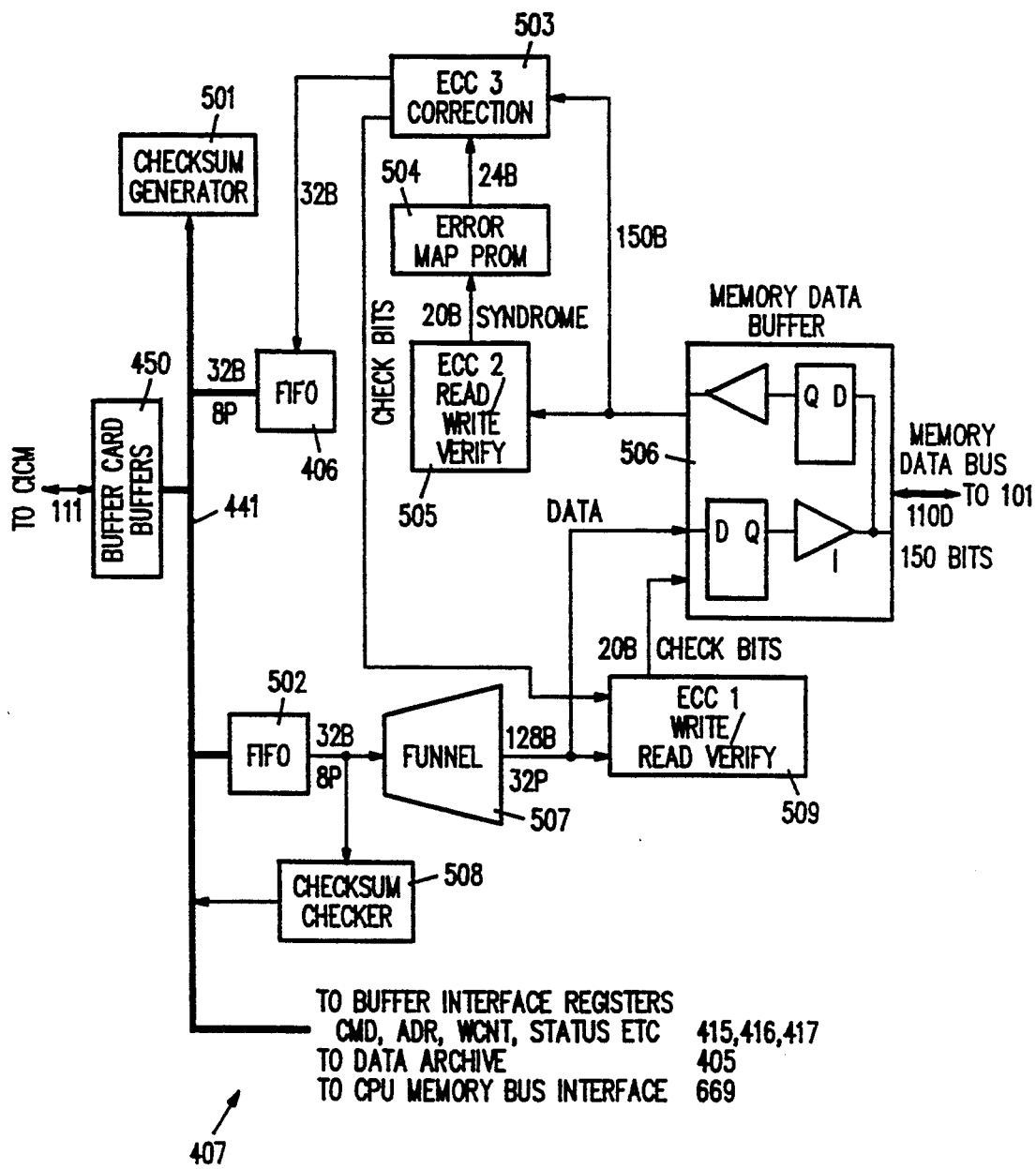
FIG. 5 is a more detailed block diagram of a portion of one embodiment of a memory controller of this invention depicting the data path and error detection and correction between a memory array and a system accessing the memory array.

FIG. 5 is a detailed block diagram of ECC Data Path 407, shown together with Buffer 450 and FIFO 406. ECC Data Path 407 operates in two primary modes, as well as a secondary, diagnostic mode, if desired. In a first mode, data is received from a host for writing into Memory Array 101. In the second mode of operation, data is read from Memory Array 101 and sent to the host.

When receiving data from the host, the data is received via Bus 111A and stored in FIFO 406 pending its output to Bus 441 under control of Buffer Controller 402 (FIG. 4). Check Sum Checker 508 serves to calculate a check sum as each 32 bit word in a block transfer is received on Bus 441, thereby accumulating a total check sum for the entire block being transferred. Upon completion of the block transfer, Check Sum Checker 508 compares its accumulated check sum with the check sum sent by the host. If these check sums do not match, Check Sum Checker 508 notifies the host via bus 111A that the block transfer failed, allowing the host to retry any desired number of times or, after a pre-determined number of failures, cease retrying or switch to the alternate memory controller path for accessing Memory Array 101 via Memory Controller 102B. Check Sum Checker 508 also flags Microprocessor 401 (FIG. 4) via bus 441 of the check sum error for use by the Microprocessor 401 in performing its diagnostics. As each 32 bit word is received on Bus 441, it is applied to Funnel 507 in order to accumulate a 128 bit memory word plus its associated 32 parity bits. The 128 data bits are applied to ECC Circuit 509 which generates 20 check bits based upon the 128 data bits received from Funnel 507. These 20 check bits, as well as the 128 bit memory word plus its 32 parity bits, are applied to Memory Data Buffer 506. Memory Data Buffer 506 checks the parity of the memory data word utilizing the 32 parity bits, prior to sending the 128 bit memory word plus the 20 check bits to Memory Array 101 via Memory Data Bus 110D. In one embodiment, there are 150 bits sent on the memory data bus: 148 data bits plus two reserved bits capable of being used in any desired manner, such as flag bits or additional error detection bits. This operation is now verified in the following manner. Memory Data Buffer 506 sends the same 150 bits that it sent to Memory Array 101 to ECC Circuit 505 which takes 128 data bits and generates 20 check bits using the same tree as is used in ECC Circuit 509. ECC Circuit 505 then compares its 20 check bits with the 20 check bits generated by ECC Circuit 509. If these two sets of 20 check bits do not match, an error has been detected in the path between ECC Code Circuit 509 and ECC Circuit 505, most likely in Memory Data Buffer 506. If such an error is detected, ECC Circuit 505 notifies the host of this error, thereby allowing the host to retry or redirect to another controller to resend the block, if desired. ECC Circuit 505 also notifies Microprocessor 401 of this error.

When data is to be read from Memory Array 101 and supplied to the host, the following process is used. A desired memory location is accessed and 148 bits (128 data bits and 20 check bits) are received from Memory Array 101 via Memory Data Buffer 506 and applied to ECC Circuit 505 and ECC Circuit 503. In one embodiment, 150 bits are received, including two reserved bits which can be used as flag bits or additional error correction bits. ECC Circuit 505 receives the 128 data bits and generates 20 check bits. These 20 check bits are compared with the 20 check bits received from Memory Array 101 and their difference becomes a 20 bit syndrome word provided to Error Map Memory 504. If the 20 syndrome bits are all logical zeros, no error has been detected. Otherwise, an error is detected and Error Map Memory 504 receives the 20 syndrome bits as a 20 bit address defining which of the 150 bits is in error. Referring to Table 2, a twenty bit syndrome is generated as the difference between the twenty check bits received from memory array 101, and the twenty check bits generated by ECC circuitry 505 based upon the 150 bits received from memory array 101. These twenty bits of the syndrome are more conveniently referred to as a five bit hex word. Each syndrome indicates which one or more of the 150 bits received from memory array 101 is in error. Table 2, for simplicity, shows only those syndromes indicating a single bit error. Errors of more than a single bit (up to a total of two groups of five bits) are indicated by a syndrome which is the exclusive-or of the syndromes associated with each of those failed bits, if those bits had been single bit errors. In one embodiment of this invention, a lookup table is used which includes a selected subset of the syndromes associated with single and multiple bit errors, to provide a lookup table of manageable size which provides the desired levels of error detection and correction.

TABLE 2

| Word Bit | Syndrome |
|---|---|
| [0] | 94AC6 |
| [1] | 4A563 |
| [2] | 84235 |
| [3] | 4239E |
| [4] | 211CF |
| [5] | EB718 |
| [6] | D498C |
| [7] | 6A4C6 |
| [8] | 94063 |
| [9] | 4A2B5 |
| [10] | 7E989 |
| [11] | 9B4D0 |
| [12] | EC868 |
| [13] | D26A4 |
| [14] | 6C3C2 |
| [15] | A7039 |
| [16] | 53A98 |
| [17] | 29D4C |
| [18] | B5CA6 |
| [19] | 5FEC3 |
| [20] | F6BCA |
| [21] | 7B5E5 |
| [22] | 9CA76 |
| [23] | EA7AB |
| [24] | D4351 |
| [25] | 7588C |
| [26] | 3AC46 |
| [27] | BC423 |
| [28] | FF295 |
| [29] | DB95E |
| [30] | 9E458 |
| [31] | EE02C |
| [32] | D3286 |
| [33] | 69943 |
| [34] | 90CB5 |
| [35] | 7D313 |

TABLE 2-continued

| Word Bit | Syndrome |
|---|---|
| [36] | 9A99D |
| [37] | E94DA |
| [38] | D586D |
| [39] | 6AEB2 |
| [40] | 82501 |
| [41] | 44094 |
| [42] | 2204A |
| [43] | 11025 |
| [44] | 08A96 |
| [45] | 8E552 |
| [46] | E60A9 |
| [47] | 732D0 |
| [48] | 39968 |
| [49] | B8E24 |
| [50] | 0F8C9 |
| [51] | A3C70 |
| [52] | 54EA8 |
| [53] | 2F7C4 |
| [54] | B69E2 |
| [55] | A48B3 |
| [56] | 526DD |
| [57] | 2C17A |
| [58] | B222D |
| [59] | 59392 |
| [60] | 849DC |
| [61] | 424EE |
| [62] | 242E7 |
| [63] | 123F7 |
| [64] | 0937F |
| [65] | CEBEC |
| [66] | C3766 |
| [67] | 64B23 |
| [68] | 32715 |
| [69] | 1C19E |
| [70] | 9B9C3 |
| [71] | E9CF5 |
| [72] | D5EFE |
| [73] | 6FFEF |
| [74] | 96F73 |
| [75] | D2169 |
| [76] | 69230 |
| [77] | 90B88 |
| [78] | 485C4 |
| [79] | 850E2 |
| [80] | A267E |
| [81] | 543AF |
| [82] | 2A353 |
| [83] | B11BD |
| [84] | 58A5A |
| [85] | 9304C |
| [86] | 49826 |
| [87] | 80E83 |
| [88] | 45555 |
| [89] | 278BE |
| [90] | 9971E |
| [91] | ED98F |
| [92] | D2CD3 |
| [93] | 6C47D |
| [94] | 972BA |
| [95] | 92DC7 |
| [96] | 4C4F7 |
| [97] | 872FF |
| [98] | 43BFB |
| [99] | 21F79 |
| [100] | 6105A |
| [101] | 3082D |
| [102] | 18692 |
| [103] | AD149 |
| [104] | F28B0 |
| [105] | 2646E |
| [106] | 162A7 |
| [107] | 0B3D7 |
| [108] | A19FF |
| [109] | 50E7B |
| [110] | C0562 |
| [111] | 65221 |
| [112] | 32B94 |
| [113] | 195CA |
| [114] | AD8E5 |
| [115] | 5A8F6 |
| [116] | 896EB |

TABLE 2-continued

| Word Bit | Syndrome |
| --- | --- |
| [117] | E5BF1 |
| [118] | 72F7C |
| [119] | 3C72E |
| [120] | BA737 |
| [121] | FC31F |
| [122] | DA19B |
| [123] | C90D9 |
| [124] | C0878 |
| [125] | 37333 |
| [126] | 1BB1D |
| [127] | A9D9A |
| [128] | F5CCD |
| [129] | 7FC72 |
| [130] | 80000 |
| [131] | 40000 |
| [132] | 20000 |
| [133] | 10000 |
| [134] | 08000 |
| [135] | 04000 |
| [136] | 02000 |
| [137] | 01000 |
| [138] | 00800 |
| [139] | 00400 |
| [140] | 00200 |
| [141] | 00100 |
| [142] | 00080 |
| [143] | 00040 |
| [144] | 00020 |
| [145] | 00010 |
| [146] | 00008 |
| [147] | 00004 |
| [148] | 00002 |
| [149] | 00001 |

ECC Correction Circuit 503 then corrects the erroneous bits and provides the corrected bits in 32 bit words plus 8 parity bits for each 32 bit word. This output is provided to bus 441, allowing Check Sum Generator 501 to generate a Check Sum for each 32-bit word received for an entire block being transferred from Memory Array 101 to the host, and provides the cumulative check sum to the host upon completion of the block transfer from Memory Array 101. The 8 bit parity is also sent to the host. Simultaneously, these 32 bits of data and 8 bit parity are sent to FIF0 502 and then to Funnel 507 for the assembly of 128 bit memory words and 32 parity bits. The 128 data bits are applied to ECC Circuit 509 which generates 20 check bits which are compared with the accumulated 20 bit check bits from ECC Circuit 503. If these two sets of 20 check bits match, no error has been detected. Conversely, if there is a discrepancy between these two sets of 20 check bits, ECC Circuit 509 has determined that an error exists in the path between and including ECC Correction Circuit 503 and ECC Circuit 509 (i.e., ECC Correction Circuit 503, FIFO 406, FIFO 502, Funnel 507, ECC Circuit 509, and Check Sum generator 501 and the buses therebetween). If such an error is detected, the host is notified so that the block may be retried or redirected. In one embodiment ECC Circuit 505 notifies Microprocessor 401 when an error has been detected, allowing Microprocessor 401 to collect statistics for diagnostic purposes. Similarly, Error Map Memory 504 provides an output signal indicating, based upon its decode of the 20 syndrome bits, which one or more bits in the 128 bit memory word are in error.

Figure 6:
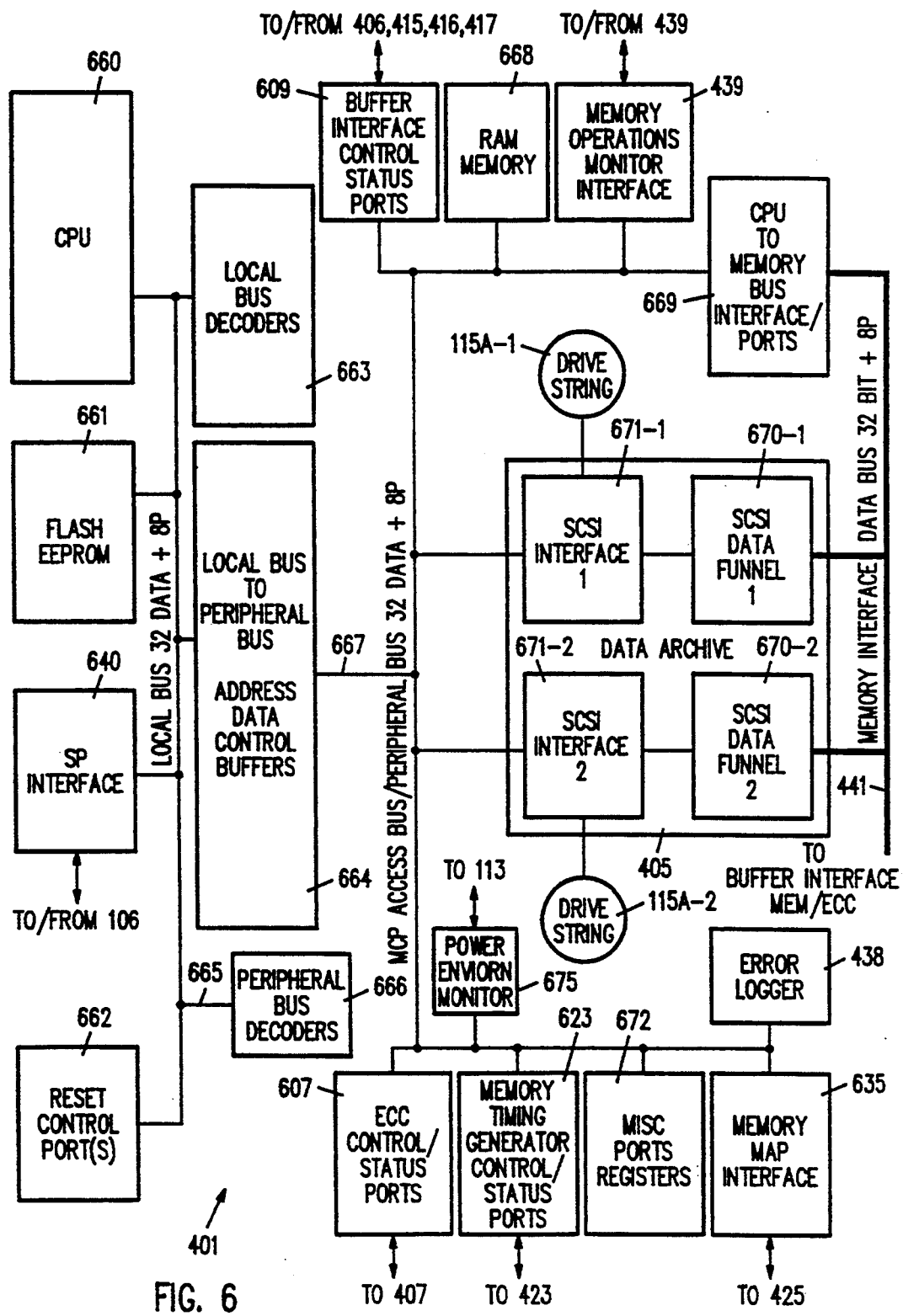
FIG. 6 block diagram of one embodiment of a memory control processor of this invention suitable for use as memory control processor 401 of FIG. 4.

FIG. 6 is a more detailed block diagram of one embodiment of Microprocessor 401. Microprocessor 401 includes CPU 660, EEPROM 661, and Local Bus Decoder 663 communicating via Local Bus 665. CPU 660 also communicates via Local Bus 665 to one or more Reset Control Ports 662 which serve to reset state machines, processors, and registers to known states upon reset, as is known in the art. Service Processor Interface 440, which in turn communicates with Service Processor 101 (FIG. 1). Local Bus to Peripheral Bus Buffer 664 allows communication between Local Bus 665 and Peripheral Bus 667. For convenience, Local Bus 665 and Peripheral Bus 667 are shown simply as Microprocessor Access Bus 481 in FIG. 4, and may be formed as a single bus in an alternative embodiment. Microprocessor 401 also includes ECC Control/Status Port 607 which communicates between Peripheral Bus 667 and ECC Data Path 407 (FIG. 4). Peripheral Bus 667 also communicates with Memory Timing Generator Control/Status Port 623 which in turn communicates with Memory Timing Generator 423 (FIG. 4). Miscellaneous Ports Register 672 serves to allow communication between Peripheral Bus 667 and various miscellaneous registers contained within Memory Controller 102A (FIG. 4). Error Logger 438 (FIG. 4) is also coupled to Peripheral Bus 667 allowing communication between Error Logger 438 and CPU 660. Memory Map Interface 635 allows communication between Peripheral Bus 667 and Memory Mapping Circuitry 425 (FIG. 4). Buffer Interface Control Status Port 609 allows communication between Peripheral Bus 667 and Buffer Controller 407 (FIG. 4). As shown in FIG. 6, Memory Operations Monitor Interface 439 is also coupled to Peripheral Bus 667, as is CPU to Memory Bus Interface/Port 669, allowing communication between Peripheral Bus 667 and Memory Interface Data Bus 441 (FIG. 4). In one embodiment, Data Save Circuitry 405 includes two separate channels, each including a SCSI Data Funnel 670-1, 670-2 and a SCSI Interface 671-1, 671-2. Each Data Funnel 670-1, 670-2 is coupled to Memory Interface Data Bus 441 for communication with its associated SCSI Interface 671-1, 671-2. SCSI Interfaces 671-1 and 671-2 are coupled to Peripheral Bus 667 and to their associated mass storage device (or string of devices) 125A-1 and 125A-2, respectively. Microprocessor 401 serves to perform diagnostics and monitoring of the operation of Memory Controller 102A, and configuration of Memory Controller 102A, and the data save archival operation.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A memory system comprising:
   a memory storage unit;
   a first memory controller having a first port for communicating with an accessing device, a second port for accessing said memory storage unit, and a first clock providing a first clock signal;
   a second memory controller having a first port for communicating with an accessing device, a second port for accessing said memory storage unit, and a second clock providing a second clock signal;
   a third clock providing a third clock signal;
   means for causing said first, second, and third clocks to synchronize; and means for selecting one of said first, second, and third clocks for use by said first and second memory controllers to control access of said memory storage unit, wherein each of said clocks comprise:
- a plurality of input leads for receiving a plurality of clock signals comprising said first, second, and third clock signals from said first, second, and third clocks;
- a voter for selecting one of a plurality of matching ones of said plurality of clock signals;
- an oscillation circuit comprising:
  - an input lead coupled to receive said selected one of said plurality of clock signals;
  - an output lead for providing a clock signal output;
  - a first inverter having an input lead serving as said input lead of said oscillation circuit, and an output lead;
  - a crystal having a first lead coupled to said output lead of said first inverter, and having an output lead;
  - a second inverter having an input lead coupled to said output lead of said crystal, and having an output lead serving as an output lead of said oscillation circuit;
  - a voltage divider having its center tap coupled to said input lead of said second inverter, thereby providing said second inverter with a known voltage level in the absence of oscillation; and
  - a resistor coupled in series between said output lead of said crystal and said input lead of said second inverter to establish a desired duty cycle of said clock signal.

2. A memory system as in claim 1 wherein said means for selecting operates by deselecting those ones of said clocks which provide clock signals which are not substantially the same as others of said clocks.

3. A memory system as in claim 1 wherein said first memory controller operates independently of and not redundantly to said second memory controller.

4. A memory system as in claim 1 wherein each of said clocks further comprises a diode coupled in series with a capacitor between said input lead of said second invertor and a supply voltage.

5. A memory system comprising:
a memory storage unit;
a first memory controller having a first port for communicating with an accessing device, a second port for accessing said memory storage unit, and a first clock providing a first clock signal;
a second memory controller having a first port for communicating with an accessing device, a second port for accessing said memory storage unit, and a second clock providing a second clock signal;
a third clock providing a third clock signal;
means for causing said first, second, and third clocks to synchronize; and
means for selecting one of said first, second, and third clocks for use by said first and second memory controllers to control access of said memory storage unit, wherein each of said clocks comprise:
- a plurality of input leads for receiving a plurality of clock signals comprising said first, second, and third clock signals from said first, second, and third clocks;
- a voter for selecting one of a plurality of matching ones of said plurality of clock signals;
- an oscillation circuit comprising:
  - an input lead coupled to receive said selected one of said plurality of clock signals;
  - an output lead for providing a clock signal output;
  - a first inverter having an input lead serving as said input lead of said oscillation circuit, and an output lead;
  - a crystal having a first lead coupled to said output lead of said first inverter, and having an output lead; and
  - a second inverter having an input lead coupled to said output lead of said crystal, and having an output lead serving as an output lead of said oscillation circuit;
  - a voltage divider having its center tap coupled to said input lead of said second inverter, thereby providing said second inverter with a known voltage level in the absence of oscillation; and
  - a diode coupled in series with a capacitor between said input lead of said second inverter and a supply voltage.

6. A memory system as in claim 5 wherein said means for selecting operates by deselecting those ones of said clocks which provide clock signals which are not substantially the same as others of said clocks.

7. A memory system as in claim 5 wherein said first memory controller operates independently of and not redundantly to said second memory controller.

* * * * *

UNITED STATES PATENT AND TRADEMARK OFFICE
CERTIFICATE OF CORRECTION

PATENT NO. : 5,379,415
DATED : Jan. 3, 1995
INVENTOR(S) : PAPENBERG ET AL.

It is certified that error appears in the above-indentified patent and that said Letters Patent is hereby corrected as shown below:

Delete drawing sheets, 5 of 24, 6 of 24, 7 of 24, and 9 of 24, and substitute therefor the drawing sheets, consisting of Figs. 2B(1), 2B(2), 2B(3) and 2B(5), as shown on the attached pages.

Signed and Sealed this

Thirty-first Day of December, 1996

Attest:

BRUCE LEHMAN

Attesting Officer        Commissioner of Patents and Trademarks

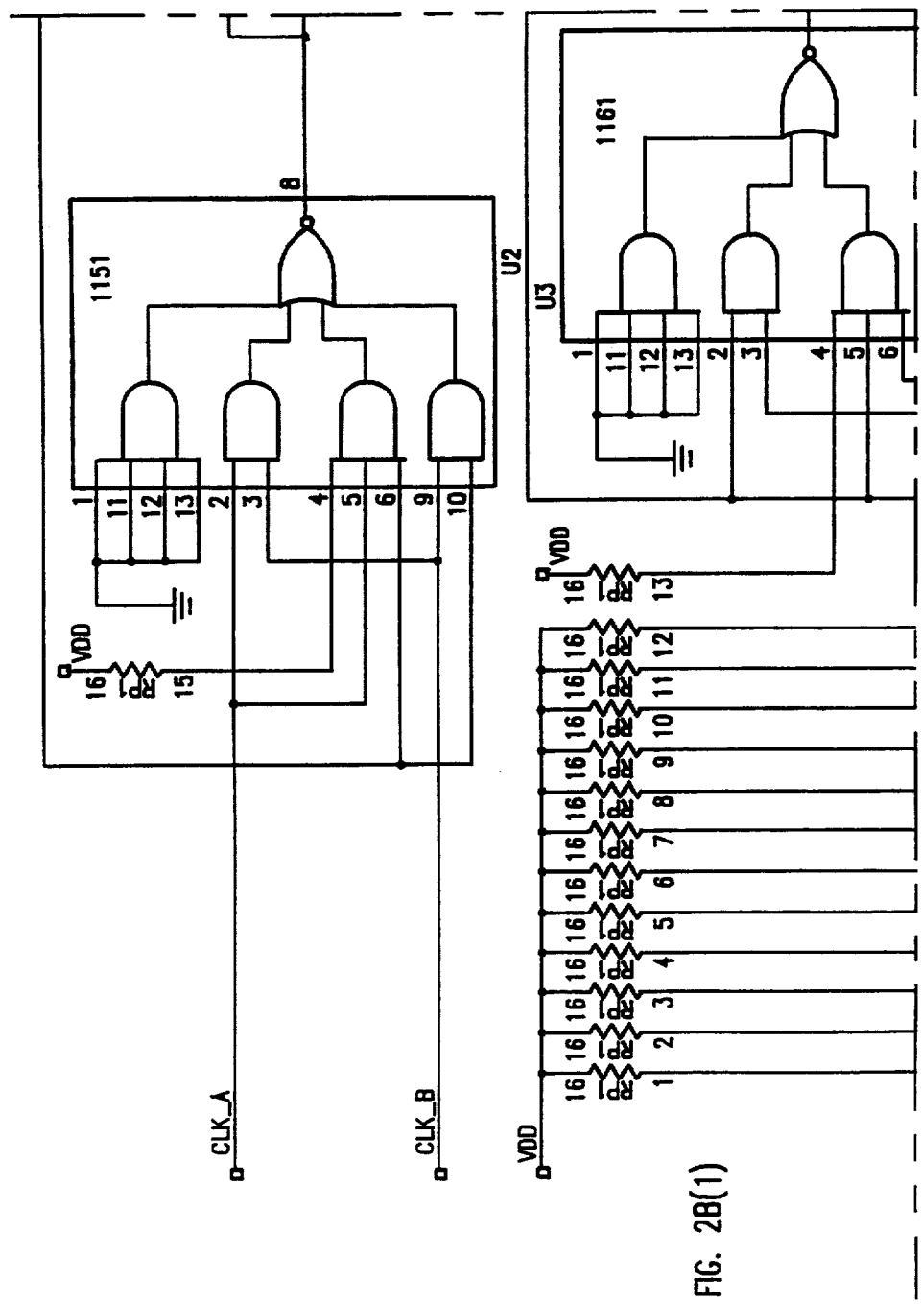
FIG. 2B(1)

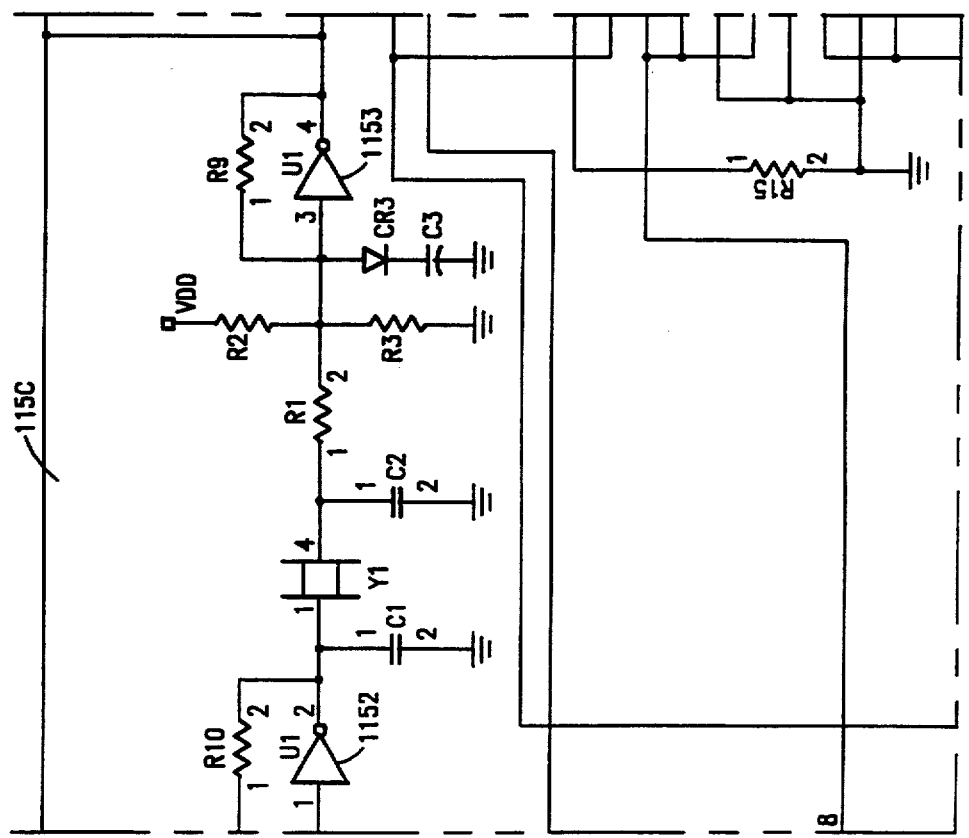
FIG. 2B(2)

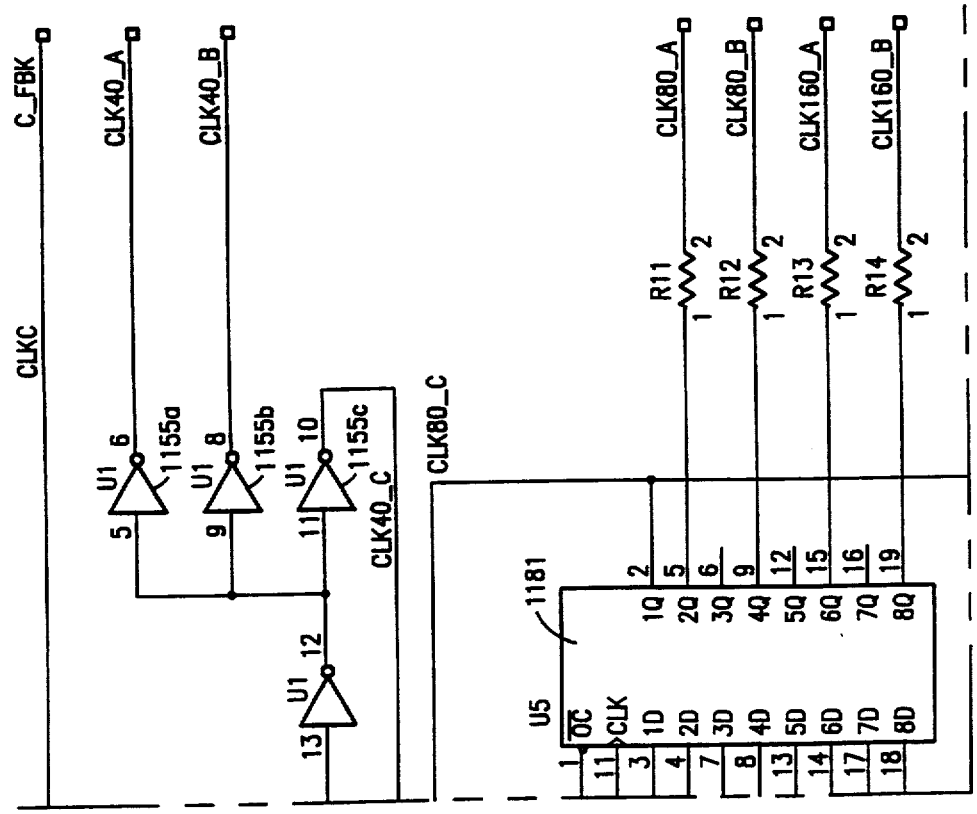
FIG. 2B(3)

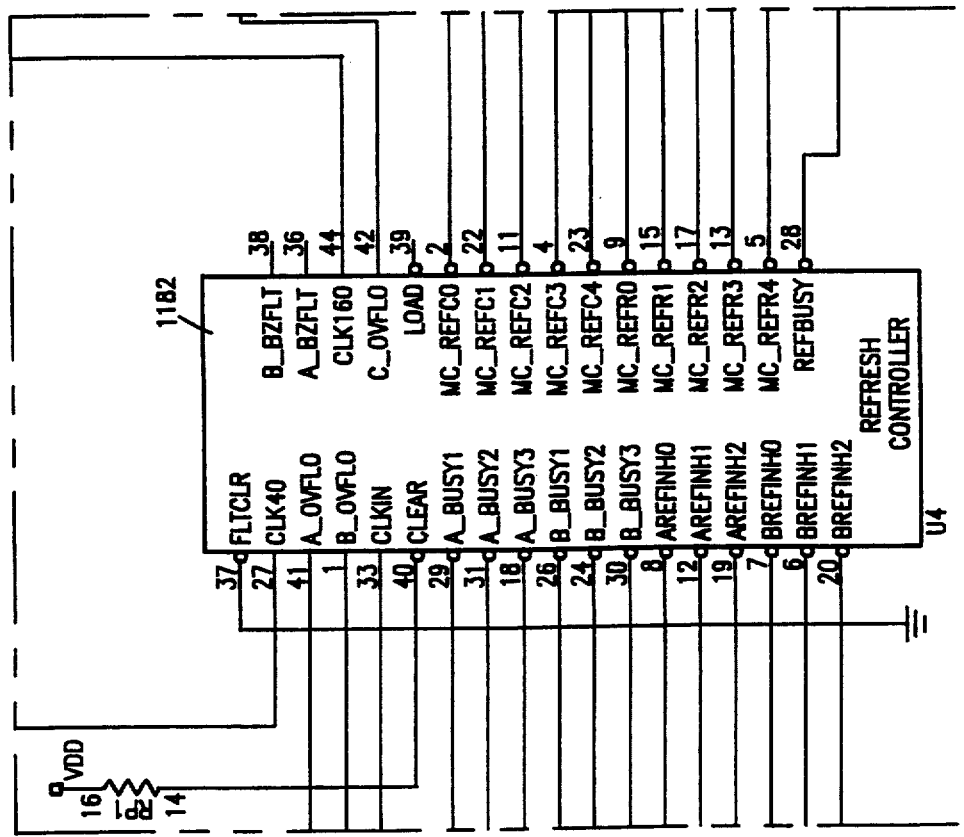
FIG. 2B(5)